(12) United States Patent
Seki

(10) Patent No.: US 7,504,818 B2
(45) Date of Patent: Mar. 17, 2009

(54) ROTATION PHASE ANGLE MEASURING DEVICE, AND CONTROL-PROTECTING DEVICES OF ELECTRIC POWER SYSTEM USING THE SAME

(75) Inventor: Kempei Seki, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 238 days.

(21) Appl. No.: 11/652,496

(22) Filed: Jan. 12, 2007

(65) Prior Publication Data

US 2007/0279039 A1 Dec. 6, 2007

(30) Foreign Application Priority Data

Jun. 1, 2006 (JP) ............... 2006-153649

(51) Int. Cl.
*G01R 23/12* (2006.01)
(52) U.S. Cl. .............. 324/76.52; 324/76.77; 324/86; 702/72
(58) Field of Classification Search ........... 324/76.52, 324/76.13; 702/72
See application file for complete search history.

(56) References Cited

U.S. PATENT DOCUMENTS 2,781,445 A * 2/1957 Stocker ............... 315/78

6,985,824 B2 1/2006 Seki
7,006,935 B2 2/2006 Seki

FOREIGN PATENT DOCUMENTS

| JP | 2004-361124 | 12/2004 |
|----|-------------|---------|
| JP | 2006-179323 | 7/2006  |

* cited by examiner

*Primary Examiner*—Vincent Q Nguyen
(74) *Attorney, Agent, or Firm*—Buchanan Ingersoll & Rooney PC

(57) ABSTRACT

The rotation phase angle measuring device measures a voltage instantaneous value of an electric power system in a period of 1/(4 N) of one period of a reference wave and integrates voltage amplitude of a squared value of the voltage instantaneous value in arbitrary timing for measuring the voltage instantaneous value. The rotation phase angle measuring device calculates chord lengths of the voltage rotation vectors in the above two timings by the integral arithmetic calculation with respect to a difference between two measured adjacent voltage instantaneous values in one pitch period including the above timing. The rotation phase angle measuring device also has a rotation phase angle calculator for calculating a phase angle of the voltage rotation vector in one pitch period including the above timing on the basis of the voltage amplitude value and the chord length value calculated by the above calculations.

14 Claims, 15 Drawing Sheets

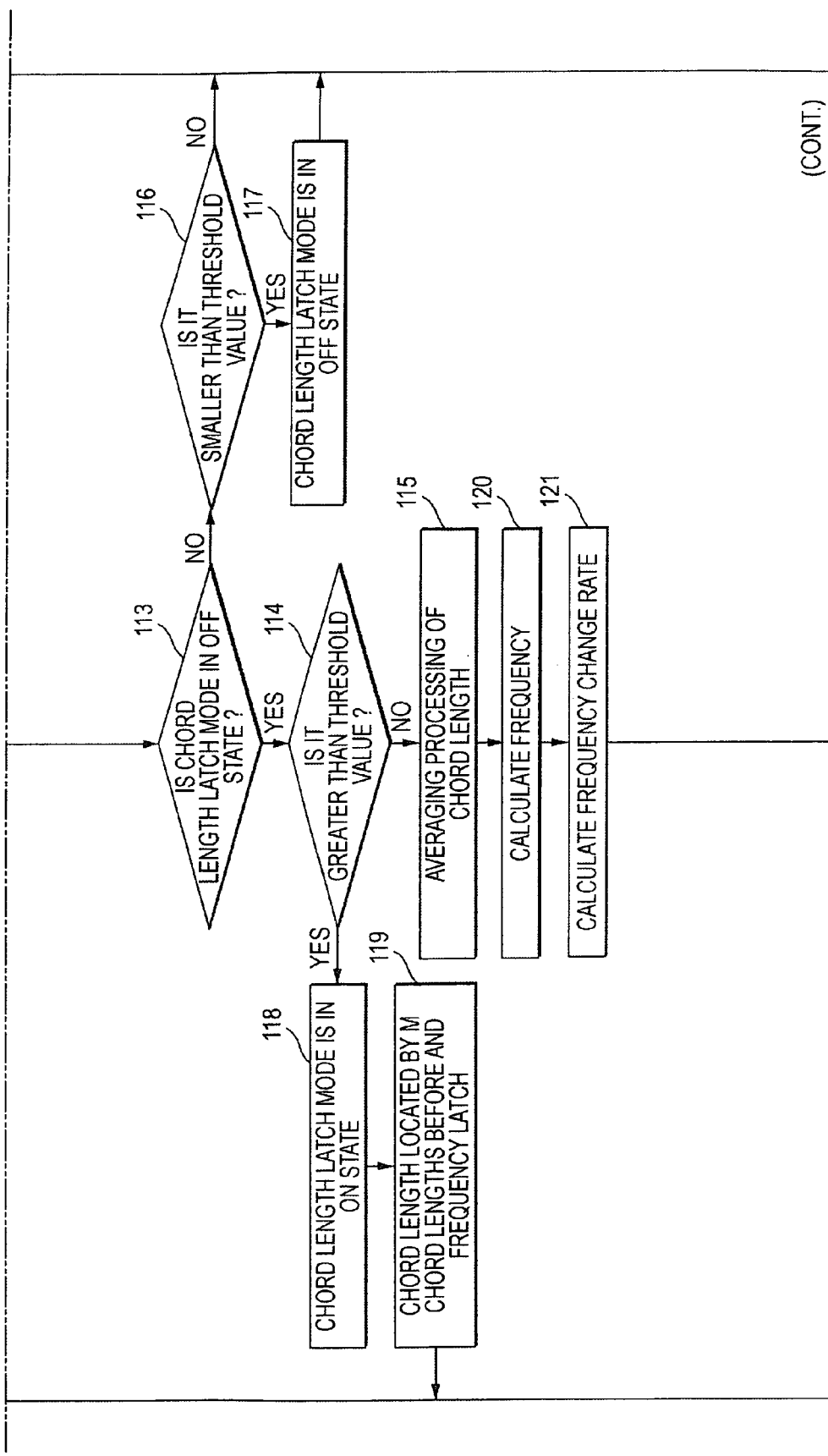

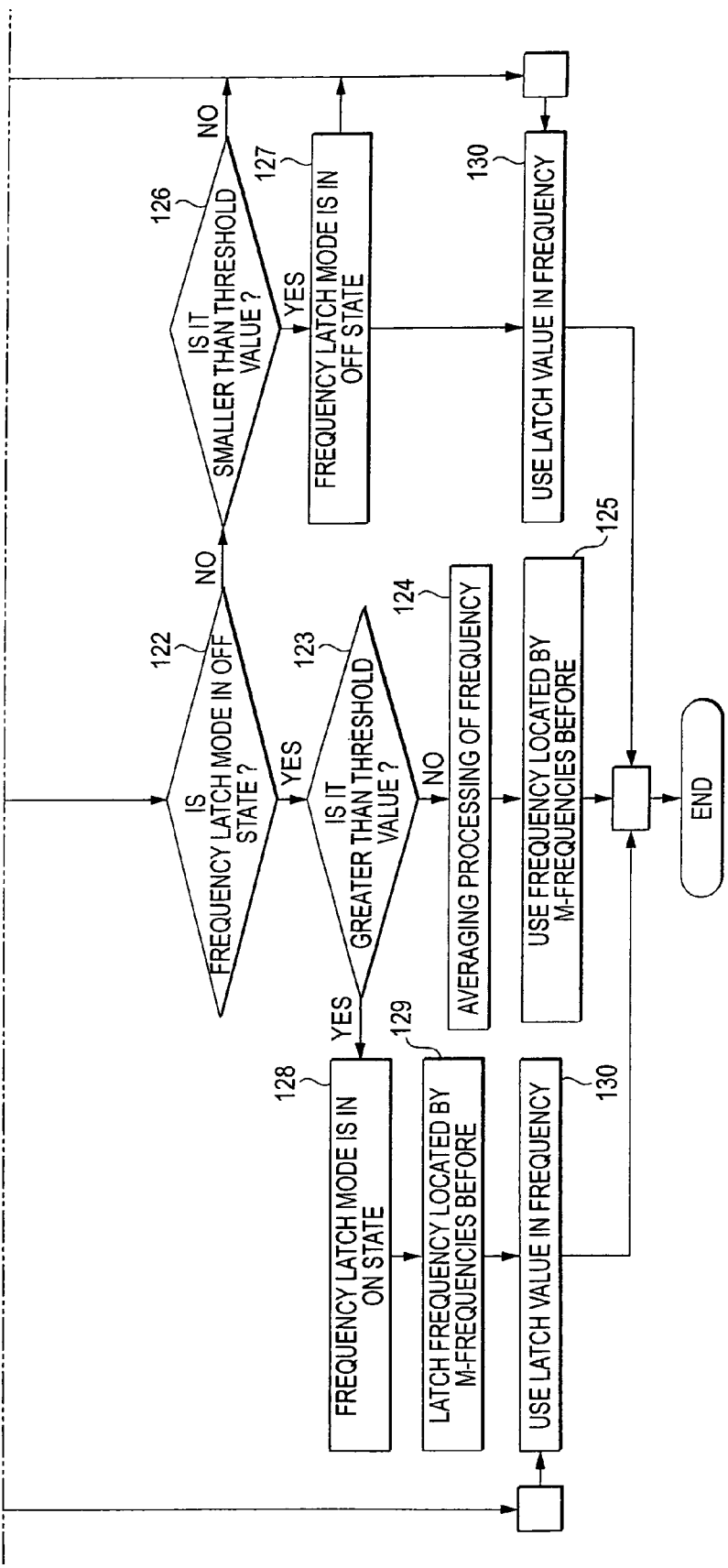

ROTATION PHASE ANGLE MEASURING DEVICE, AND CONTROL-PROTECTING DEVICES OF ELECTRIC POWER SYSTEM USING THE SAME

BACKGROUND OF THE INVENTION

1. Field of the Invention

The present invention relates to a rotation phase angle measuring device, and an improvement of a control-protecting devices of an electric power system using this rotation phase angle measuring device, e.g., a frequency measuring device, a synchronizing vector measuring device, an synchronous switching controller (SSC), an automatic synchronizer (ASY) and a phase judging device.

2. Background Art

In recent years, the supply of electric power of high reliability and quality is required as a current within the electric power system becomes complicated. For example, necessity of a performance improvement of a basic device required in control and protection of the electric power system such as a frequency measuring device for monitoring a system frequency of a bus line voltage, etc. in an electric power plant, an electric power substation, etc., a synchronizing vector measuring device for calculating an electric amount from the electric power system at high speed, an synchronous switching controller, a automatic synchronizer, a phase judging device, etc. is raised more and more.

The present inventors have already proposed that a coping method using a rotation vector as a spiral vector theory is useful to improve control and protection performance of the electric power system. This is based on a basic technique for expressing an alternating current voltage and current as a vector rotated in the counterclockwise direction on a complex plane. For example, there is a frequency measuring device as described in patent literature 1 (U.S. Pat. No. 6,985,824). In this frequency measuring device, the voltage of the electric power system is measured in timing for equally dividing one period of a reference wave by 4N (N is a positive integer). A voltage rotation vector having a tip for setting this measured voltage to a real part coordinate, and setting the voltage previously measured 90 degrees to an imaginary part coordinate is then calculated. The length of a chord for connecting the tip of this voltage rotation vector and the tip of a voltage rotation vector located by one before is calculated. A voltage effective value is then calculated from the voltage measured between one timing and timing located by one period of the reference wave before. The frequency of the electric power system is calculated from a phase angle of the voltage rotation vector calculated on the basis of an adding value of the above chord length and the above voltage effective value.

Further, a synchronizing vector measuring device is proposed in patent literature 2 (U.S. Pat. No. 7,006,935). In this synchronizing vector measuring device, in each of the above timings, a voltage instantaneous value is presumed from the above frequency calculated in self timing by using a frequency measuring principle using the above voltage rotation vector. An absolute phase angle is calculated by using this presuming value of the voltage instantaneous value. Thus, a synchronous vector can be measured during a short time of one period of the electric power system.

Further, a pole opening-closing phase controller is proposed in patent literature 3 (Japanese patent publication No. 2006-179323). In this pole opening-closing phase controller, an initial vector is calculated from the calculated frequency and absolute phase angle by using the above synchronizing vector measuring principle. An estimating vector is then calculated in consideration of time required in an estimate and an operation in this initial vector. A control delay time is calculated from this estimating vector and a target vector as a target. An opening-closing pole command signal is then transmitted to a circuit breaker in consideration of this control delay time. Thus, turning-on or interruption of the circuit breaker is controlled by a phase based on the frequency and the absolute phase angle accurately calculated.

Furthermore, an automatic synchronizer is proposed in patent literature 4 (Japanese patent application No. 2006-27866). In this automatic synchronizer, passing time until conformity of voltage phases of both systems intended to be simultaneously turned on from a reference time is estimated from the calculated frequency and absolute phase angle by using the above synchronizing phasor measuring principle. Turning-on time of the synchronizing turning-on is then calculated on the basis of this estimating value, and a synchronizing turning-on operation signal is outputted so that a transient electric current based on the turning-on, etc. are restrained to sufficiently small levels.

However, in each of the above systems of the Background Art, a value located 90 degrees before is used in the imaginary part of the rotation vector. Therefore, when a measuring object frequency is shifted from a reference frequency, a problem exists in that a calculating error of the voltage effective value becomes large so that a measuring error of the absolute phase angle becomes large. Further, errors due to voltage drop, a sudden phase change, etc. are generated. For example, problems exist in that phase is changed by load switching of the system, and the change of the frequency is increased and an erroneous operation is performed by exceeding an operation threshold value of a frequency change relay (UFR or OFR), etc.

SUMMARY OF THE INVENTION

This invention is made to solve these problems, and provides a rotation phase angle measuring device of high accuracy even at a frequency shifted from that of the reference wave or in the electric power system having many noises.

Further, this invention provides a control-protecting device of the electric power system of a frequency measuring device, a synchronizing vector measuring device, a pole opening-closing phase controller, a automatic synchronizer, a phase judging device, etc. of high accuracy by using the principle of the above rotation phase angle measuring device.

This invention is basically constructed by a rotation phase angle measuring device comprising:

voltage measuring means for measuring a voltage instantaneous value v of an electric power system in a period $1/(4N)$ (N is a positive integer) of one period of a reference wave when the voltage instantaneous value v of the electric power system is expressed by a voltage rotation vector rotated in the counterclockwise direction with an origin 0 on a complex plane as a center;

voltage amplitude calculating means for calculating a voltage amplitude value by an integral arithmetic calculation of a squared value of the measured voltage instantaneous value v in arbitrary timing for measuring the voltage instantaneous value v;

chord length calculating means for calculating the length of a chord connecting tips of the voltage rotation vectors in the two timings by the integral arithmetic calculation with respect to a difference between two measured adjacent voltage instantaneous values v in one pitch period including the timing; and rotation phase angle calculating means for calculating a phase angle of the voltage rotation vector in one pitch period including the timing on the basis of the voltage amplitude value calculated by the voltage amplitude calculating means and the chord length value calculated by the chord length calculating means.

In accordance with this invention, it is possible to make the measurement of an electric amount of high accuracy avoiding an influence of noises without being influenced by a change of frequency. Further, various kinds of electric power system control-protecting devices of higher precision and high reliability removing various kinds of distortions and an influence of system disturbance are obtained by monitoring a voltage amplitude change rate, a chord length change rate and a frequency change rate, and adjusting these threshold values.

The foregoing and other object, features, aspects, and advantages of the present invention will become more apparent from the following detailed description of the present invention when taken in conjunction with the accompanying drawings.

DESCRIPTION OF THE PREFERRED EMBODIMENTS

Embodiment Mode 1

Figure 1:
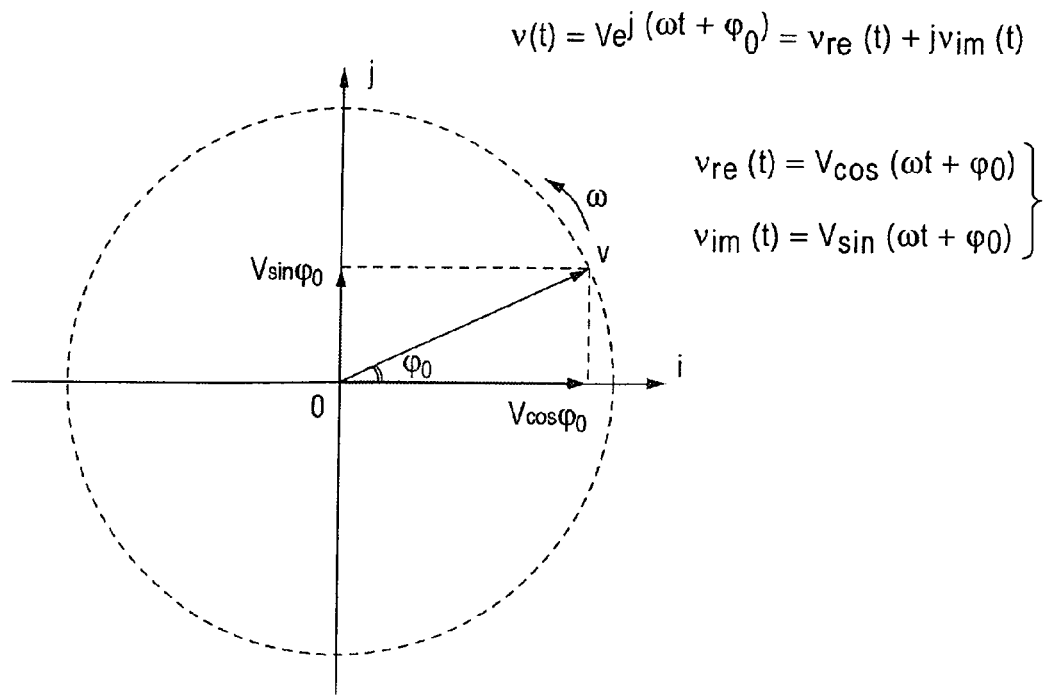
FIG. 1 is a view of a voltage rotation vector shown on a complex plane.

First, an algorithm using a voltage rotation vector as a measuring object of the present invention will be explained. FIG. 1 is a view of the voltage rotation vector shown on a complex plane, and a voltage instantaneous value v of an electric power system is shown so as to be rotated in the counterclockwise direction with an origin 0 on the complex plane as a center. When the voltage instantaneous value is expressed by the voltage rotation vector in this way, this measured voltage has a real part vre(t)=V cos(ωt+φo) of the instant voltage, and an imaginary part vim(t)=V sin(ωt+φo) of the instant voltage. Further, the voltage instantaneous value is represented by v(t)=vre(t)+jvim(t). Here, V is a voltage amplitude, and ω is an angular velocity of the voltage rotation vector, and φo is a phase angle of voltage initial rotation angle.

ω has the relation of ω=2πf between angular velocity ω and frequency f of a measuring object electric power system. For convenience, the voltage instantaneous value vre(t) is set to be represented by v(t) from here.

Figure 2:
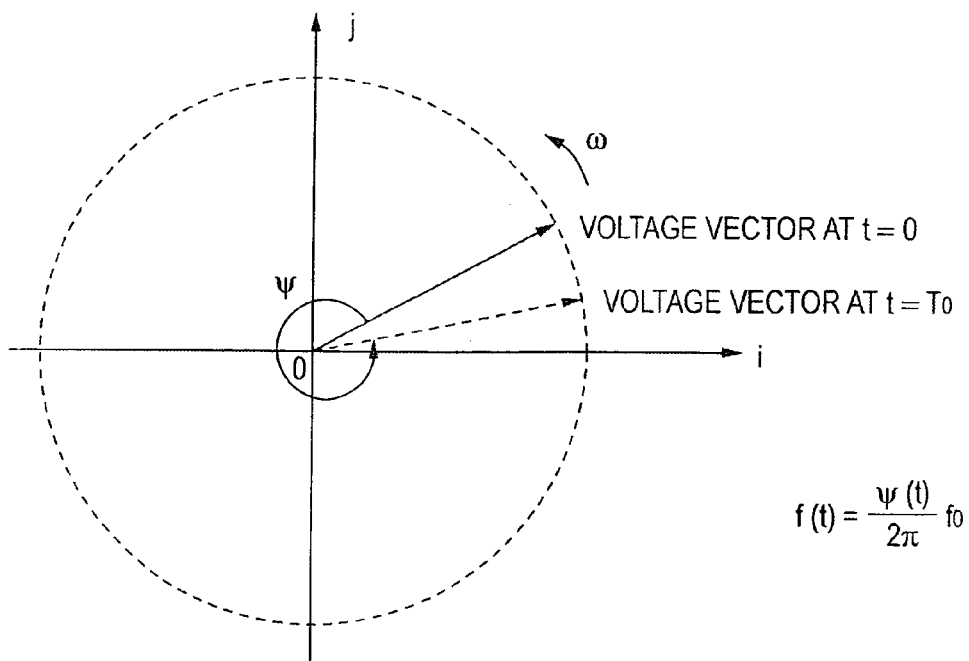
FIG. 2 is a view showing a rotating situation of a measuring object voltage vector at one period time of a reference wave.

FIG. 2 shows the rotation of the measuring object voltage vector at one period time of a reference wave. The voltage rotation vector of the electric power system of the measuring object is rotated by a phase angle ψ (radian) in the counterclockwise direction within the complex plane during one period of the reference wave, i.e., during time from t=0 to t=T0. Accordingly, electric power system frequency f(t) of the measuring object can be simply calculated by using the following formula from a proportional relation of this phase angle ψ(t) and reference wave frequency fo.

$$f(t) = \frac{\psi(t)}{2\pi} f_0 \qquad (1)$$

This formula corresponds to formula 10 of the above patent literature 1, and its details are explained in this literature and this explanation is therefore omitted. Thus, the electric power system frequency can be calculated if the rotation phase angle ψ(t) of the voltage vector during one period of the reference wave is known.

Figure 3:
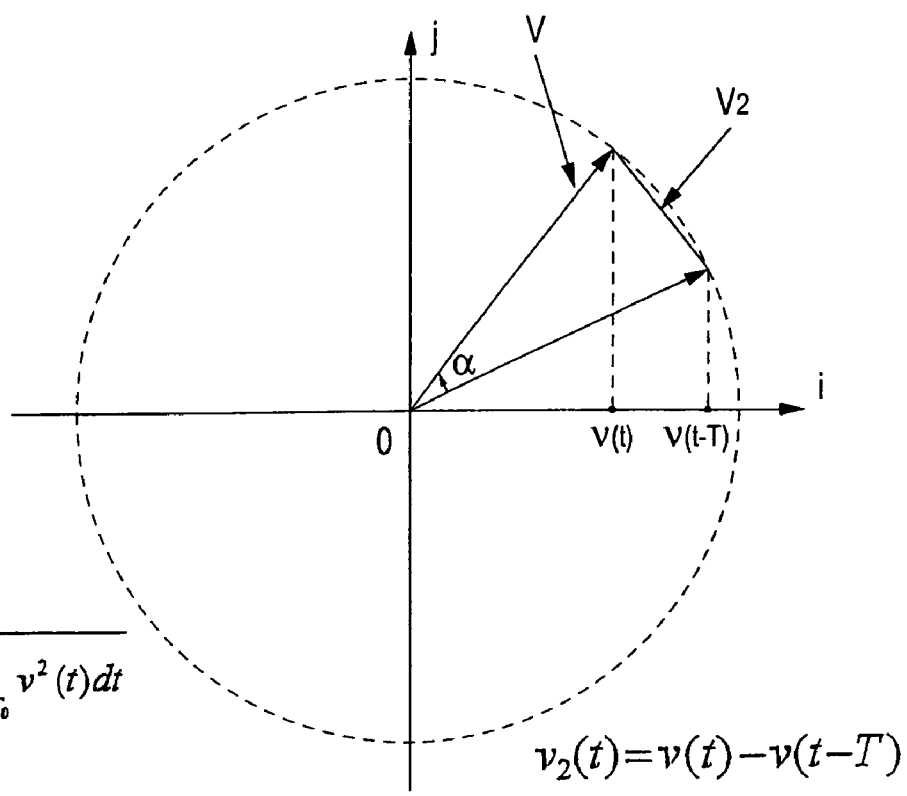
FIG. 3 is a view for explaining the calculations of a voltage amplitude and a chord length between two points of tips of voltage rotation vectors.

Next, a calculating method of this rotation phase angle will be explained. In the above patent literature 1, the rotation phase angle is calculated from a chord length total L12(k) and a voltage effective value Vave at all timing intervals provided by equally dividing one period of the reference wave by 4N (N is an integer) (see formula 8). In contrast to this, in this invention, the rotation phase angle is calculated from a voltage amplitude value in one timing provided by equally dividing one period of the reference wave by 4N (N is an integer) and a chord length at one interval (one sampling timing rotation phase angle) including the above timing. First, the voltage amplitude and the chord length connected by the tip of the rotation vector are calculated from the measured voltage instantaneous value. The voltage vector rotation phase angle is then calculated on the basis of the calculated voltage amplitude and chord length. A theoretical calculating formula of the voltage amplitude and the chord length will be explained by using FIG. 3.

[Introduction of Voltage Amplitude Calculating Formula]

Namely, the voltage instantaneous value of the electric power system is set to be measured in timing provided by equally dividing one period of the reference wave by 4N (N is an integer), and the voltage amplitude V can be theoretically calculated from the following formula.

$$V(t) = \sqrt{\frac{2}{T_0} \int_{-T_o}^{0} v^2(t) dt} \qquad (2)$$

Here, v(t) is the voltage instantaneous value, and To is one cycle time. To=0.02 second is set in a system of 50 Hz, and To=0.0166667 second is set in a system of 60 Hz.

A concrete numerical calculation is made to verify the above formula (2) when the amplitude of an input voltage waveform is 40V, and the reference wave frequency is 50 Hz, and the actual frequency is 50 Hz.

The pitch of the calculation is set to an electric angle of 30 degrees (N=3 is set and one circumference is equally divided into 12 portions when the reference wave is equally divided by 4N). Thus, formula (2) is provided as in the following formula.

$$V = \sqrt{\frac{1}{6} \sum_{k=1}^{12} v(12-k)^2} \qquad (3)$$

Figure 4:
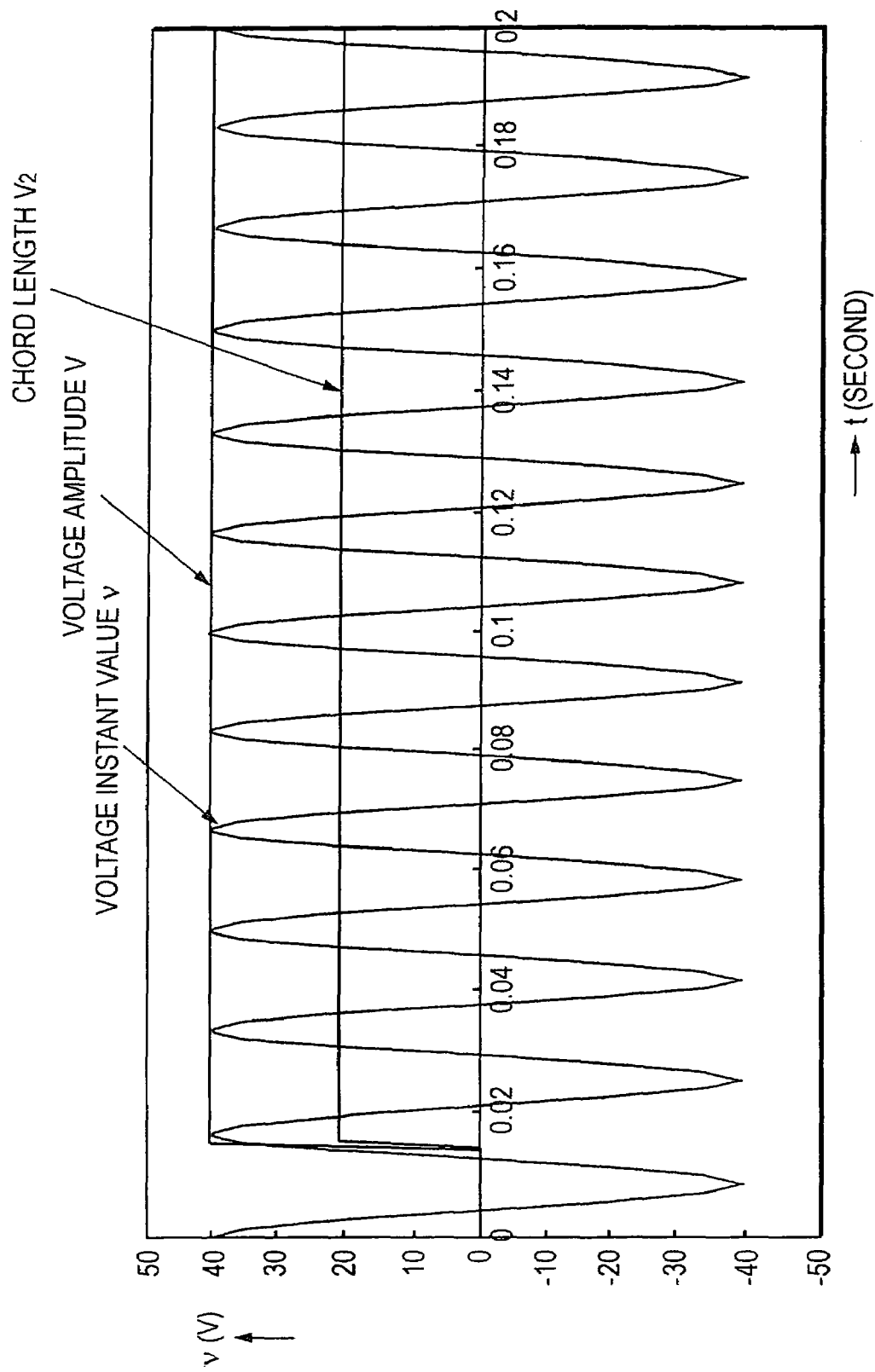
FIG. 4 is a view showing calculating results of the voltage amplitude V and the chord length $V_2$ of a sine wave.

As a result of the calculation using the above formula, as shown by the voltage amplitude waveform V of FIG. 4, it has been found that the calculating value of the voltage amplitude V and the amplitude of the input voltage instantaneous value waveform v are always conformed. Similar effects are also obtained in all the other calculating conditions. Accordingly, it has been confirmed that the voltage amplitude calculating formula of formula (2) is correct.

[Introduction of Chord Length Calculating Formula]

Next, the chord length $V_2$ can be theoretically calculated from the following formula.

$$V_2(t) = \sqrt{\frac{2}{T_0} \int_{-T_o}^{0} \{v(t) - v(t-T)\}^2 dt} \qquad (4)$$

Here, v(t) is the voltage instantaneous value, and To is one cycle time. T is one calculating sampling timing. T=0.001666667 second is set in the case of N=3 when the reference wave is equally divided by 4N in the 50 Hz system. A numerical calculation is made to verify formula (4) when the amplitude of the input voltage amplitude is 40V, and the reference wave frequency is 50 Hz, and the actual frequency is 50 Hz.

The pitch of the calculation is set to an electric angle of 30 degrees (N=3 is set and one circumference is equally divided into 12 portions when the reference wave is equally divided by 4N). Thus, formula (4) is provided as in the following formula.

$$V_2 = \sqrt{\frac{1}{6} \sum_{k=1}^{12} \{v(12-k) - v(11-k)\}^2} \qquad (5)$$

As a result of the calculation made by using the above formula (5), as shown by the chord length $V_2$ of FIG. 4, it has been found that the measured chord length value is always conformed to the chord length value of the above theory. Similar effects are also obtained in all the other calculating conditions. Accordingly, it has been confirmed that the voltage amplitude calculating formula of formula (4) is correct.

A concrete value of the chord length is theoretically calculated by the following formula from Pythagorean theorem. (In this case, the phase angle is 30 degrees with respect to one sampling timing rotation phase angle).

$$V_2 = 2V \sin 15° = 2 \times 40 \times \sin 15° = 20.7055 \qquad (6)$$

[Introduction of Voltage Amplitude Calculating Formula Uninfluenced by Frequency]

As can be seen from the above explanation, it has been confirmed that the values of voltage amplitude V and chord length $V_2$ are grasped as stable values having no distortion with respect to a change of the voltage instantaneous value of a higher harmonic wave noise, etc. However, when formulas (2) and (4) are applied as they are, errors of the voltage amplitude and the chord length at a measuring frequency dislocated from the reference wave are gradually increased. This is because the voltage instantaneous value v(t) (i.e., v(t)=V cos (ωt+φ0)) influenced by frequency is included in both these formulas.

Therefore, averaging processing is performed by the following two calculating formulas to reduce the shifting of frequency. (One cycle is a recommending value, and stability is more preferable in a longer cycle.)

$$V_{ave}(t) = \frac{1}{4N} \sum_{k=0}^{4N-1} V(t-kT) \qquad (7)$$

$$V_{2ave}(t) = \frac{1}{4N} \sum_{k=0}^{4N-1} V_2(t-kT) \qquad (8)$$

However, even when such averaging processing is performed, the errors are reduced to a certain extent, but the degree of the reduction using the averaging processing is limited.

Therefore, in the present invention, the following voltage amplitude calculating formula uninfluenced by such a frequency change is further introduced.

$$V(t) = \sqrt{\frac{1}{2N} \left[ \sum_{k=N}^{3N-1} v^2(t-kT) - \sum_{k=0}^{2N-1} v(t-kT) \cdot v\{t-(2N+k)T\} \right]} \qquad (9)$$

Here, the reference wave is equally divided by 4N.

A numerical calculation is made to verify formula (7) when the amplitude of the input voltage waveform is 40V, and the reference wave frequency is 50 Hz, and the actual frequency is 45 Hz shifted from the reference wave frequency.

The pitch of the calculation is set to an electric angle of 30 degrees (N=3 is set and one circumference is equally divided into 12 portions when the reference wave is equally divided by 4N). Thus, formula (7) is provided as in the following formula.

$$V(t) = \sqrt{\frac{1}{6}\left[\sum_{k=3}^{8} v^2(t-kT) - \sum_{k=0}^{5} v(t-kT) \cdot v\{t-(6+k)T\}\right]} \quad (10)$$

Here, $$\sum_{k=3}^{8} v^2(t-kT) - \sum_{k=0}^{5} [v(t-kT) \cdot v\{t-(6+k)T\}] = \quad (11)$$
$$v^2(t-3T) + v^2(t-4T) + v^2(t-5T) + v^2(t-6T) + v^2(t-7T) +$$
$$v^2(t-8T) - v(t) \cdot v(t-6T) - v(t-T) \cdot v(t-7T) -$$
$$v(t-2T) \cdot v(t-8T) - v(t-3T) \cdot v(t-9T) -$$
$$v(t-4T) \cdot v(t-10T) - v(t-5T) \cdot v(t-11T)$$

Figure 5:
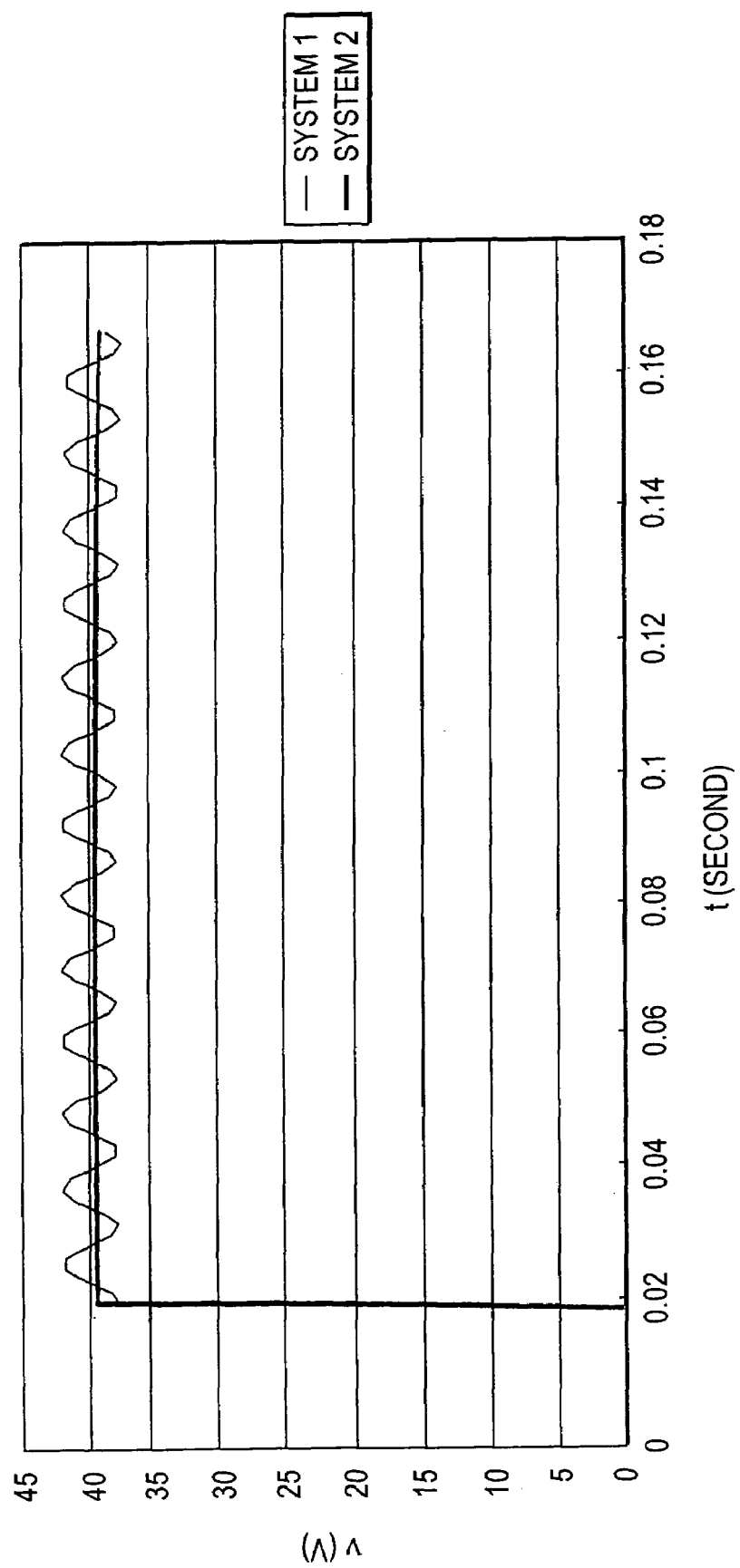
FIG. 5 is a comparison view of calculating results using an amplitude calculating formula.

The calculating results are shown in FIG. 5. System 1 shows the calculating result of formula (2), and system 2 shows the calculating result of formula (10). Thus, it is understood that the calculating result of system 1 is greatly vibrated, but the calculating result of system 2 is stable. Accordingly, it is understood that no calculating result of formula (10) is influenced by frequency.

[Introduction of Chord Length Calculating Formula Uninfluenced by Frequency]

Similarly, the following chord length calculating formula uninfluenced by the frequency change is also introduced in the chord length calculating formula of formula (4).

$$V_2(t) = \sqrt{\frac{1}{2N}\left[\sum_{k=N}^{3N-1} v_2^2(t-kT) - \sum_{k=0}^{2N-1} v_2(t-kT) \cdot v_2\{t-(2N+k)T\}\right]} \quad (12)$$

Here, $v_2$ (t) is calculated as in the following formula.

$$v_2(t) = v(t) - v(t-T) \quad (13)$$

Here, v(t) is the voltage instantaneous value.

A numerical calculation is made to verify formula (10) when the amplitude of the input voltage waveform is 40V, and the reference wave frequency is 50 Hz, and the actual frequency is 45 Hz.

The pitch of the calculation is set to an electric angle of 30 degrees (N=3 is set and one circumference is equally divided into 12 portions when the reference wave is equally divided by 4N). Thus, formula (10) is provided as in the following formula.

$$V_2(t) = \sqrt{\frac{1}{6}\left[\sum_{k=3}^{8} v_2^2(t-kT) - \sum_{k=0}^{5} v_2(t-kT) \cdot v_2\{t-(6+k)T\}\right]} \quad (14)$$

Here, $$\sum_{k=3}^{8} v_2^2(t-kT) - \sum_{k=0}^{5} v_2(t-kT) \cdot v_2\{t-(6+k)T\} = \quad (15)$$
$$v_2^2(t-3T) + v_2^2(t-4T) + v_2^2(t-5T) + v_2^2(t-6T) + v_2^2(t-7T) +$$
$$v_2^2(t-8T) - v_2(t) \cdot v_2(t-6T) - v_2(t-T) \cdot v_2(t-7T) -$$
$$v_2(t-2T) \cdot v_2(t-8T) - v_2(t-3T) \cdot v_2(t-9T) -$$
$$v_2(t-4T) \cdot v_2(t-10T) - v_2(t-5T) \cdot v_2(t-11T)$$

Figure 6:
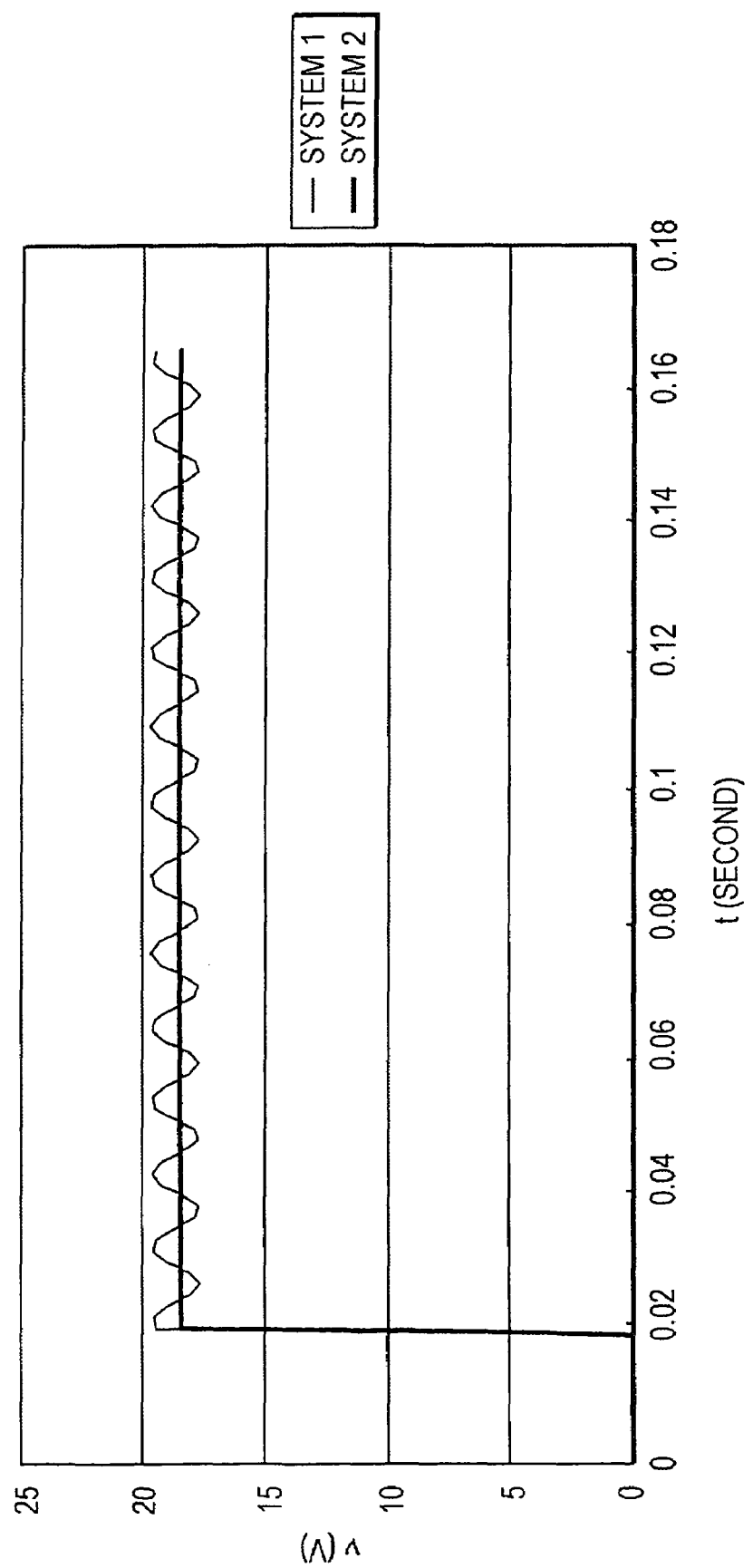
FIG. 6 is a comparison view of calculating results using a chord length calculating formula.

The calculating results are shown in FIG. 6. In this figure, system 1 shows the calculating result of formula (5), and system 2 shows the calculating result of formula (14). Thus, it is understood that the calculating result of system 1 is greatly vibrated, but the calculating result of system 2 is stable. It is also understood that no calculating result of formula (14) is influenced by frequency.

From the above calculating results, the rotation phase angle ψ(t) as the electric angle for rotating the voltage rotation vector in one period of the reference wave is calculated from the following formula.

$$\alpha(t) = \sin^{-1}\frac{V_{2ave}(t)}{2V_{ave}(t)} \quad (16)$$

$$\psi(t) = 8N \cdot \alpha(t) \quad (17)$$

α(t) of formula (16) is ½ of the rotation phase angle at one sampling pitch from a certain timing to the next timing.

As mentioned above, the rotation phase angle calculator in the present invention calculates the voltage amplitude and the chord length by using the voltage amplitude calculating formula of formula (2) and the chord length calculating formula of formula (4), and also calculates the rotation phase angle of the rotation vector on the basis of these calculated voltage amplitude and chord length. Thus, the values of the voltage amplitude V and the chord length $V_2$ can be grasped as stable values having no distortion with respect to a change of the voltage instantaneous value of a higher harmonic wave noise, etc. Further, the voltage amplitude and the chord length are calculated by using the voltage amplitude calculating formula of formula (9) and the chord length calculating formula of formula (12). Thus, it is possible to calculate the voltage amplitude and the chord length uninfluenced by a frequency change with respect to this frequency change. Thus, the phase, the frequency, etc. of the electric power system can be further accurately and simply grasped. Accordingly, as described later, the present invention can be applied to a control-protecting device of the electric power system of a wide range such as a frequency measuring device, a synchronizing vector measuring device, an synchronous switching controller, a automatic synchronizer, a phase judging device, etc.

Figure 7:
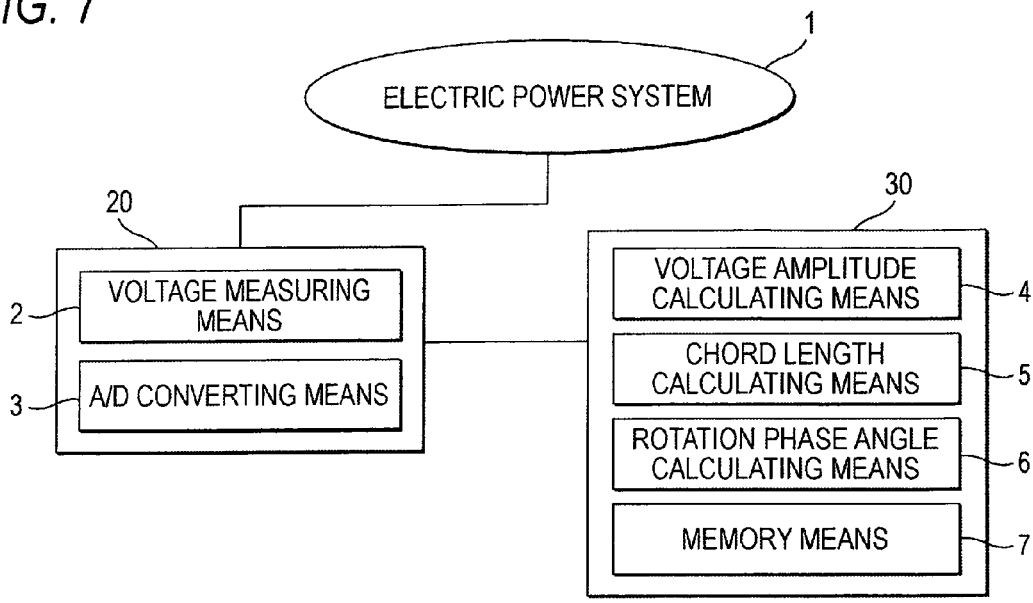
FIG. 7 is a function block diagram showing the entire construction of a rotation phase angle calculator in accordance with embodiment mode 1 of this invention.

FIG. 7 is a function block diagram showing the entire construction of a rotation phase angle calculator in accordance with embodiment mode 1 of this invention. This rotation phase angle calculator in this embodiment mode is constructed by a voltage measuring device 2 for measuring the voltage instantaneous value of the electric power system 1, an A/D converting means 3 for converting a measured input analog voltage into digital voltage data, and a memory means 7 for storing the above digital conversion data. The rotation phase angle calculator is also constructed by a voltage amplitude calculating means 4 for calculating the voltage amplitude of the above voltage instantaneous value and performing movement average processing, a chord length calculator 5 for calculating the length of a chord made in shape between tip portions of adjacent voltage rotation vectors every sampling and performing movement average processing, and a rotation phase angle calculating means 6 for calculating the rotation phase angle of the rotation vector by using the above calculating values of the voltage amplitude and the chord length.

The voltage measuring means 2 and the A/D converting means 3 are constructed by a voltmeter 20 having a digital voltage output terminal. Further, the voltage amplitude calculating means 4, the chord length calculating means 5, the rotation phase angle calculating means 6, and the memory means 7 are constructed by a computer 30. The computer 30 is constructed by well-known CPU, RAM, ROM and interface circuit, and software for performing various kinds of calculation processing explained below is built in the computer 30.

The voltage measuring means 2 measures the voltage of the electric power system in a period of one 4N-th (N is a positive integer) of one period of the reference wave. The voltage amplitude calculating means 4 calculates the voltage amplitude value V not relative to frequency in self timing from the above measured voltage in past 4N timings including the self timing in each timing for measuring the above voltage (see formula (9)). As explained in FIG. 3, the chord length calculating means 5 calculates the length of the chord connecting the tip of the voltage rotation vector in the above timing and the tip of the voltage rotation vector in timing set by one before the above timing (see formula (12)).

The rotation phase angle calculating means 6 calculates the rotation phase angle of the rotation vector by using the above voltage amplitude calculating value and chord length calculating value, and formulas (16) and (17).

Figure 8:
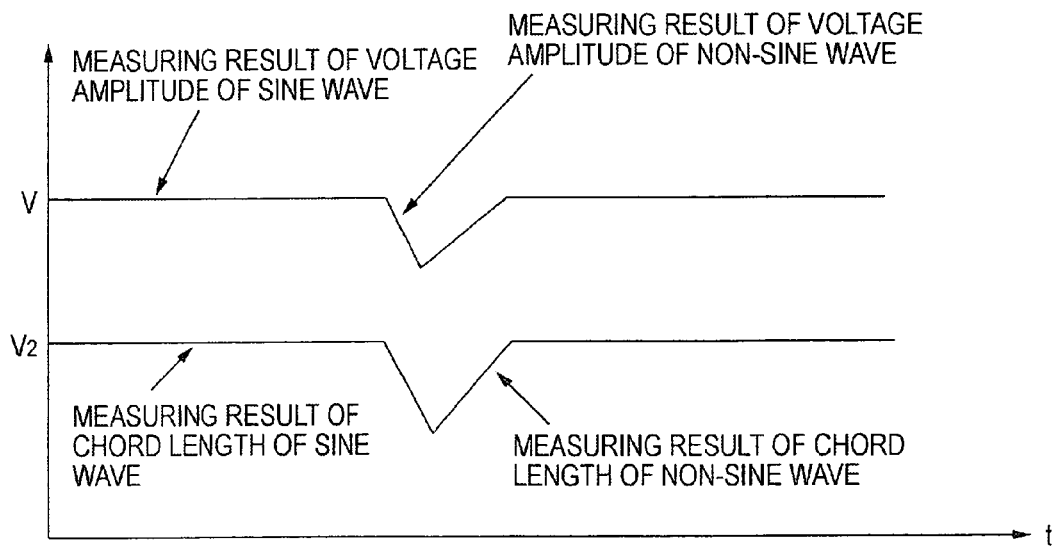
FIG. 8 is a view showing a sudden change judging technique of the voltage amplitude/chord length.

Subsequently, a sudden change judging technique of the voltage amplitude V and the chord length $V_2$ will be explained with reference to FIG. 8.

The above voltage amplitude calculating formula (9) and chord length calculating formula (12) are calculated at an instantaneous value of one cycle (12 points when pitch is 30 degrees, and 96 points when pitch is 3.75 degrees). Therefore, there is averaging processing in the case of a sine wave. Therefore, even when noises are superposed more or less, it is considered that these noises can be neglected and there is no sudden change of the voltage amplitude and the chord length. However, in the case of a non-sine wave, there is a possibility that the calculating results of the voltage amplitude and the chord length are greatly changed by a sudden phase change (e.g., a sudden phase change due to load turning-on, falling-off, etc.) or instant stoppage (e.g., it drops until 90% of a rated value during several cycles by a distant system accident)

Therefore, it is judged whether the voltage amplitude, the chord length or frequency is latched by arranging threshold values of a voltage amplitude change rate and a chord length change rate, and respectively calculating the change rates of real time.

First, the voltage amplitude change rate is calculated as in the following formula.

$$\frac{dV}{dt} = \frac{V(t) - V_{ave}(t-4NT)}{V_{ave}(t-4NT)} \geq C_{VSET} \quad (18)$$

Here, $C_{VSET}$ is a threshold value of the voltage amplitude change rate.

Next, the chord length change rate is calculated as in the following formula.

$$\frac{dV_2}{dt} = \frac{V_2(t) - V_{2ave}(t-4NT)}{V_{2ave}(t-4NT)} \geq C_{V2SET} \quad (19)$$

Here, $C_{V2SET}$ is a threshold value of the chord length change rate.

Accordingly, when the above voltage amplitude change rate becomes greater than the threshold value $C_{VSET}$, or when the above chord length change rate becomes greater than the threshold value $C_{V2SET}$, the voltage amplitude, the chord length or frequency is latched.

Here, values $V_{ave}(t-4NT)$ and $V_{2ave}(t-4NT)$ (one cycle) set by one cycle before are used, but it is generally desirable to set ¼ cycle or more.

Subsequently, a sudden change judging technique of frequency will be explained with reference to FIG. 9.

Frequency is calculated as follows by using the above formulas (1) and (17).

$$f(t) = \frac{\psi(t)}{2\pi} f_0 = \frac{8N \cdot \alpha(t)}{2\pi} f_0 \quad (20)$$

Next, movement average processing is performed by the following formula.

$$f_{ave}(t) = \frac{1}{4N} \sum_{k=0}^{4N-1} f(t-kT) \quad (21)$$

Further, a frequency change rate is calculated as in the following formula.

$$\frac{df}{dt} = \frac{f(t) - f_{ave}(t-4NT)}{f_{ave}(t-4NT)} \geq C_{fSET} \quad (22)$$

Here, $C_{fSET}$ is a threshold value of the frequency change rate. A sudden change of frequency due to a distorted wave is detected by this formula.

Figure 9:
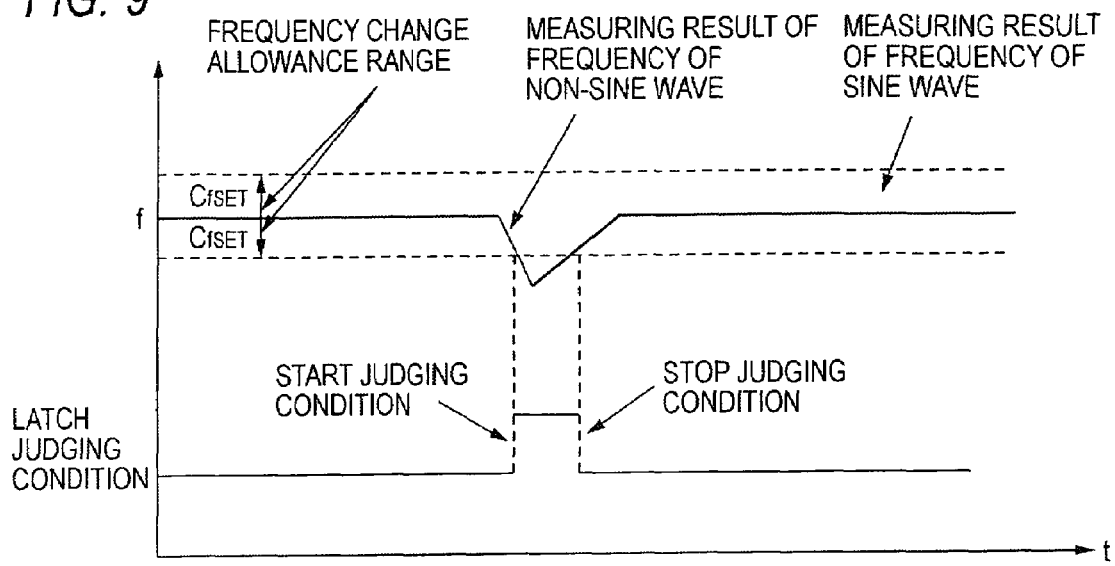
FIG. 9 is a view showing a sudden change judging technique of frequency.

As shown in FIG. 9, only when a measuring result of frequency of a non-sine wave exceeds the threshold value $C_{fSET}$ of the frequency change rate (when the measuring result exceeds a frequency change allowance range), a latch judging condition (described later in detail) is started.

Embodiment Mode 2

Figure 10:
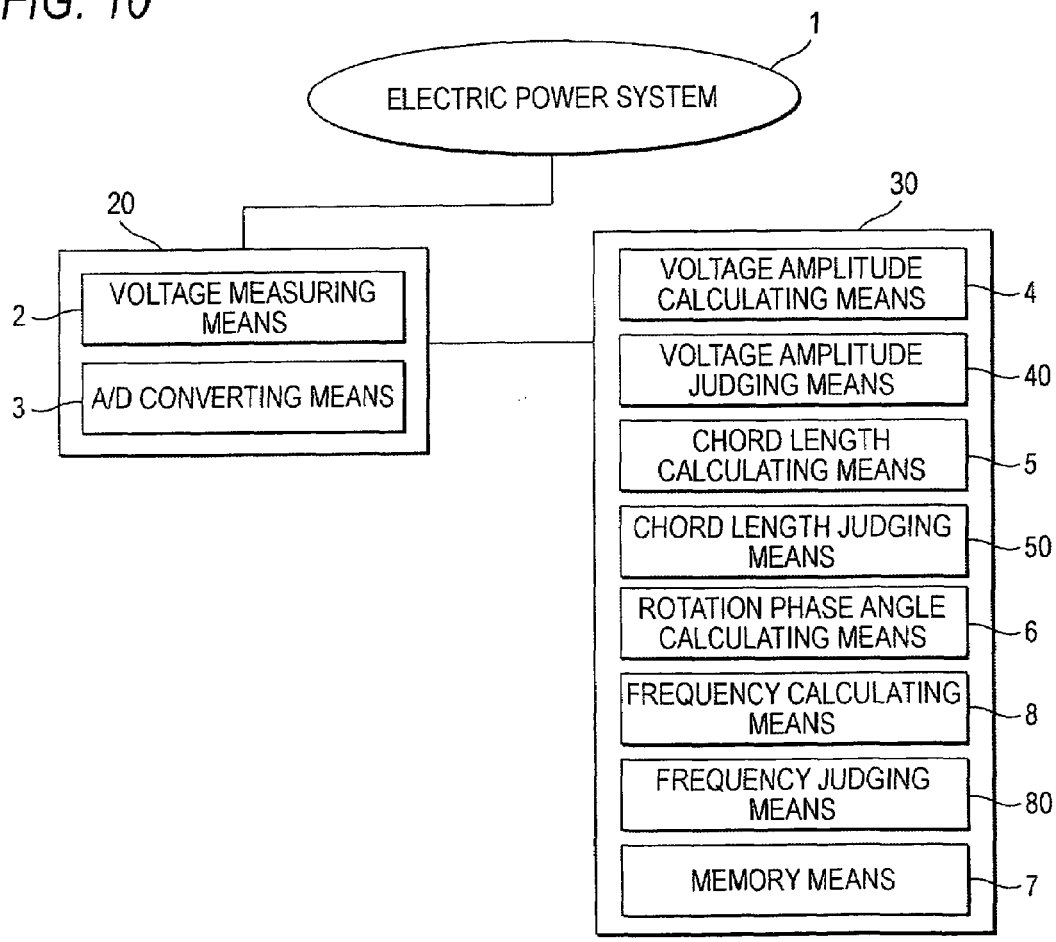
FIG. 10 is a function block diagram showing the entire construction of a frequency measuring device in accordance with embodiment mode 2 of this invention.

FIG. 10 is a function block diagram showing the entire construction of a frequency measuring device in accordance with embodiment mode 2 of this invention. In this figure, the same reference numerals as FIG. 7 show the same or corresponding portions. In the frequency measuring device in accordance with this embodiment mode 2, a voltage measuring device 2, an A/D converting means 3, a memory means 12, a voltage amplitude calculating means 4, a chord length calculator 5 and a rotation phase angle calculating means 6 are the same as FIG. 7. As mentioned above, a voltage amplitude judging means 40 calculates a voltage amplitude change rate of the voltage amplitude, and compares this voltage amplitude change rate with a threshold value (see formula (18)). Further, a chord length judging device 50 calculates a change rate of the above chord length, and compares this change rate with a threshold value (see formula (19)). Further, a frequency calculating means 8 calculates frequency (see formula (20)), and performs movement average processing (see formula (21)). A frequency judging means 80 calculates a frequency change rate and compares the frequency change rate with a threshold value (see formula (22)).

Next, the operation of the frequency measuring device will be explained in accordance with the flow chart of FIG. 11 with reference to the above entire construction of FIG. 10 and the explanations of FIGS. 1 to 9.

First, in step 101, the voltage measuring means 2 of FIG. 10 measures the voltage of an electric power system as a measuring object every timing of sampling. The timing at this time is shown by t. Timing measured by one time before can be shown by (t−1), and the next timing can be shown by (t+1). Next, the A/D converting means 3 converts the above measuring voltage as an analog signal into a digital voltage signal, and stores this value to the memory means 7. As shown in FIG. 1, when a voltage instantaneous value v of the electric power system is expressed by a voltage rotation vector rotated in the counterclockwise direction with an origin 0 on a complex plane as a center, this measured voltage is the above instant voltage real part vre(t).

In step 102, the voltage amplitude is calculated by the voltage amplitude calculating means 4 using formula (7). Next, in step 103, the voltage amplitude change rate is calculated by the voltage amplitude judging means 40. Namely, in step 104, it is judged whether a voltage amplitude latch mode is in an OFF state. When the voltage amplitude latch mode is in the OFF state, it proceeds to step 105. In contrast to this, when the voltage amplitude latch mode is in an ON state, it proceeds to step 107. Subsequently, it is judged in step 105 whether a voltage amplitude chord length latch mode is converted by using formula (18). When the voltage amplitude change rate is greater than a threshold value $C_{VSET}$ of the voltage amplitude change rate (collation is continuously performed three times for reliability), it proceeds to step 109. In contrast to this, when the voltage amplitude change rate is smaller than the threshold value $C_{VSET}$ of the voltage amplitude change rate, it proceeds to step 106. In step 106, movement average processing of the voltage amplitude is performed by using formula (7).

When the voltage amplitude latch mode is ON in step 107, it proceeds to step 108 in a case smaller than the threshold value $C_{VSET}$ of the voltage amplitude change rate by the calculating formula of the voltage amplitude change rate of the following formula (23) (collation is continuously performed three times for reliability). In contrast to this, it proceeds to step 130 in a case greater than the threshold value of the voltage amplitude change rate.

$$\frac{dV}{dt} = \frac{V(t) - V_{ave}(\text{latch})}{V_{ave}(\text{latch})} < C_{VSET} \quad (23)$$

Here, $V_{ave}$(latch) is a voltage amplitude value latched in step 110.

In step 109, the voltage amplitude latch mode is set to the ON state from the OFF state. Further, in step 110, the voltage amplitude and frequency values at a point located by M-points before the present time point are latched (held), and it proceeds to step 130. Namely, the voltage amplitude is latched as in the following formula.

$$V_{ave}(\text{latch}) = V_{ave}(t-MT) \quad (24)$$

Frequency is also simultaneously latched as in the following formula.

$$f_{ave}(\text{latch}) = f_{ave}(t-MT) \quad (25)$$

Here, M is an integer. M=0 may be also set. However, when stability of data is also required, stability is more preferable when M=4N (one cycle).

Subsequently, in step 111, the chord length is calculated by the chord length calculating means 6 using formula (10). Further, in step 112, the chord length change rate is calculated by the chord length judging means 7 using formula (19). In step 113, it is judged whether a chord length latch mode is in an OFF state. If the chord length latch mode is in the OFF state, it proceeds to step 114. In contrast to this, if the chord length latch mode is in an ON state, it proceeds to step 116.

In step 114, it is judged whether the chord length latch mode is converted by using formula (19). When the chord length change rate is greater than a threshold value $C_{v2set}$ of the chord length change rate (is collated three times), it proceeds to step 118. In contrast to this, when the chord length change rate is smaller than the threshold value $C_{v2set}$, it proceeds to step 115. In step 115, movement average processing of the chord length is performed by using formula (8).

In step 116, it is judged whether the chord length change rate is smaller than the threshold value $C_{V2SET}$ of the chord length change rate by using the following formula (26). When the chord length change rate is smaller than the threshold value $C_{V2SET}$ (is collated three times), it proceeds to step 117. In contrast to this, when the chord length change rate is greater than the threshold value $C_{V2SET}$, it proceeds to step 130.

$$\frac{dV_2}{dt} = \frac{V_2(t) - V_{2ave}(\text{latch})}{V_{2ave}(\text{latch})} < C_{V2SET} \quad (26)$$

Here, $V_{2ave}$(latch) is a chord length value latched in step 119.

In step 117, the chord length latch mode is changed from the ON state to the OFF state.

On the other hand, in step 118, the chord length latch mode is changed from the OFF state to the ON state. In step 119, chord length and frequency values at a point located by M-points before the present time point are latched (held), and it then proceeds to step 130. Namely, the chord length latch value is provided as follows.

$$V_{2ave}(\text{latch}) = V_{2ave}(t-MT) \quad (27)$$

Simultaneously, frequency is also latched as in the above formula (25).

In step 120, frequency is calculated by the frequency calculating means 8 using formulas (18) to (20). Subsequently, in step 121, a frequency change rate is calculated by the frequency judging means 9 using formula (22).

In step 122, it is judged whether a frequency latch mode is in an OFF state. If the frequency latch mode is in the OFF state, it proceeds to step 123. In contrast to this, if the frequency latch mode is in an ON state, it proceeds to step 126. In step 123, it is judged whether the frequency change rate calculated in the above step 121 is greater than a threshold value $C_{fset}$ of the frequency change rate by using formula (22). When the frequency change rate is greater than the threshold value of the frequency change rate, it proceeds to step 128. In contrast to this, when the frequency change rate is smaller than the threshold value of the frequency change rate, it proceeds to step 124. In step 124, movement average processing of frequency is performed by using formula (21). Further, in step 125, frequency located by M-frequencies before is used as in the following formula.

$$f(t) = f_{ave}(t-MT) \quad (28)$$

Here, $f_{ave}$(t−MT) is used instead of $f_{ave}$(t) because the frequency located by M-frequencies before is used in an operation at a latching time, and conformity to this frequency is held.

On the other hand, in step 126, it is judged whether the frequency change rate is smaller than the threshold value $C_{fSET}$ of the frequency change rate by using the following formula. When the frequency change rate is smaller than the threshold value $C_{fSET}$ of the frequency change rate (is collated three times), it proceeds to step 127. In contrast to this, when the frequency change rate is greater than the threshold value of the frequency change rate, it proceeds to step 130.

$$\frac{df}{dt} = \frac{f(t) - f_{ave}(\text{latch})}{f_{ave}(\text{latch})} < C_{fSET} \tag{29}$$

Here, $f_{ave}$(latch) is a chord length value latched in step 129.

In step 127, the frequency latch mode is changed from the ON state to the OFF state. On the other hand, in step 128, the frequency latch mode is changed from the OFF state to the ON state.

In step 129, the frequency located by M-frequencies before is latched as in formula (25). In step 130, the latch value is used in frequency as in the following formula.

$$f(t) = f(\text{latch}) \tag{30}$$

As mentioned above, the frequency measuring device in the present invention calculates the voltage amplitude and the chord length by using a voltage amplitude calculating value not relative to frequency, and also calculates the rotation phase angle of the rotation vector on the basis of these calculated voltage amplitude and chord length so that frequency can be measured. Accordingly, an accurate measurement can be also made even at frequency shifted with respect to the reference wave. Further, the change rate of the above voltage amplitude, chord length or frequency is calculated so that a sudden change of each value is detected and latch to a predetermined value is performed. Accordingly, a frequency measuring device of high precision and high reliability able to remove an influence of noises, etc., and remove a distortion influence of a flicker phenomenon of instant stoppage, a sudden phase change, etc. is obtained.

Embodiment Mode 3

In embodiment mode 3 of the present invention, an example for applying this invention to a synchronizing phasor device will be explained. In the synchronizing phasor device shown in patent literature 2, the absolute phase angle is calculated on the basis of a voltage effective value average value and a voltage real instant presuming value. However, in accordance with embodiment mode 3 of this invention, an absolute phase angle β is calculated from a voltage real instant presuming value $v_{est}(t)$ and a voltage amplitude average value $V_{ave}(t)$.

Figure 11:
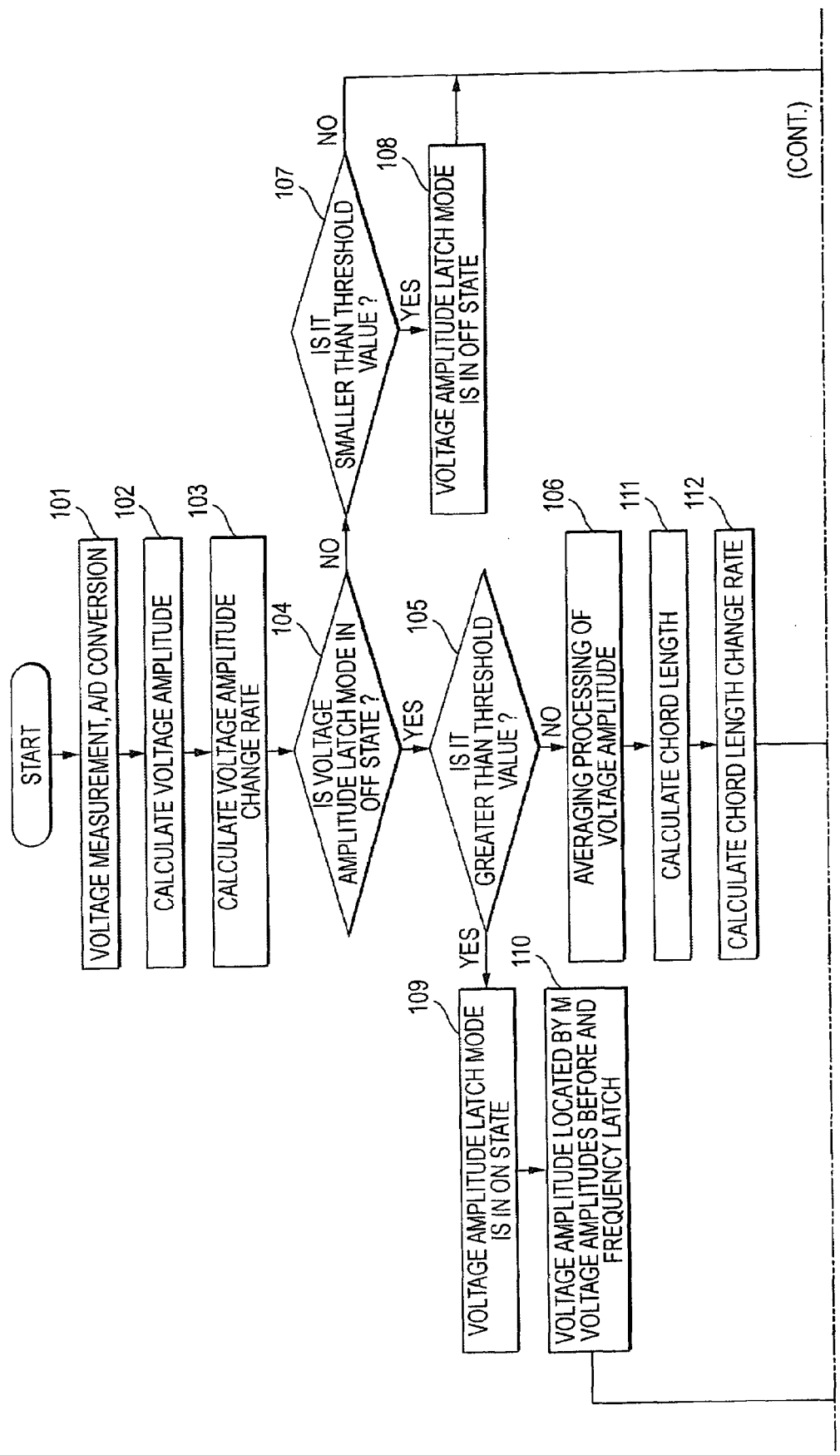
FIG. 11 is a flow chart showing steps of a frequency calculation in the above embodiment mode 2.
Figure 12:
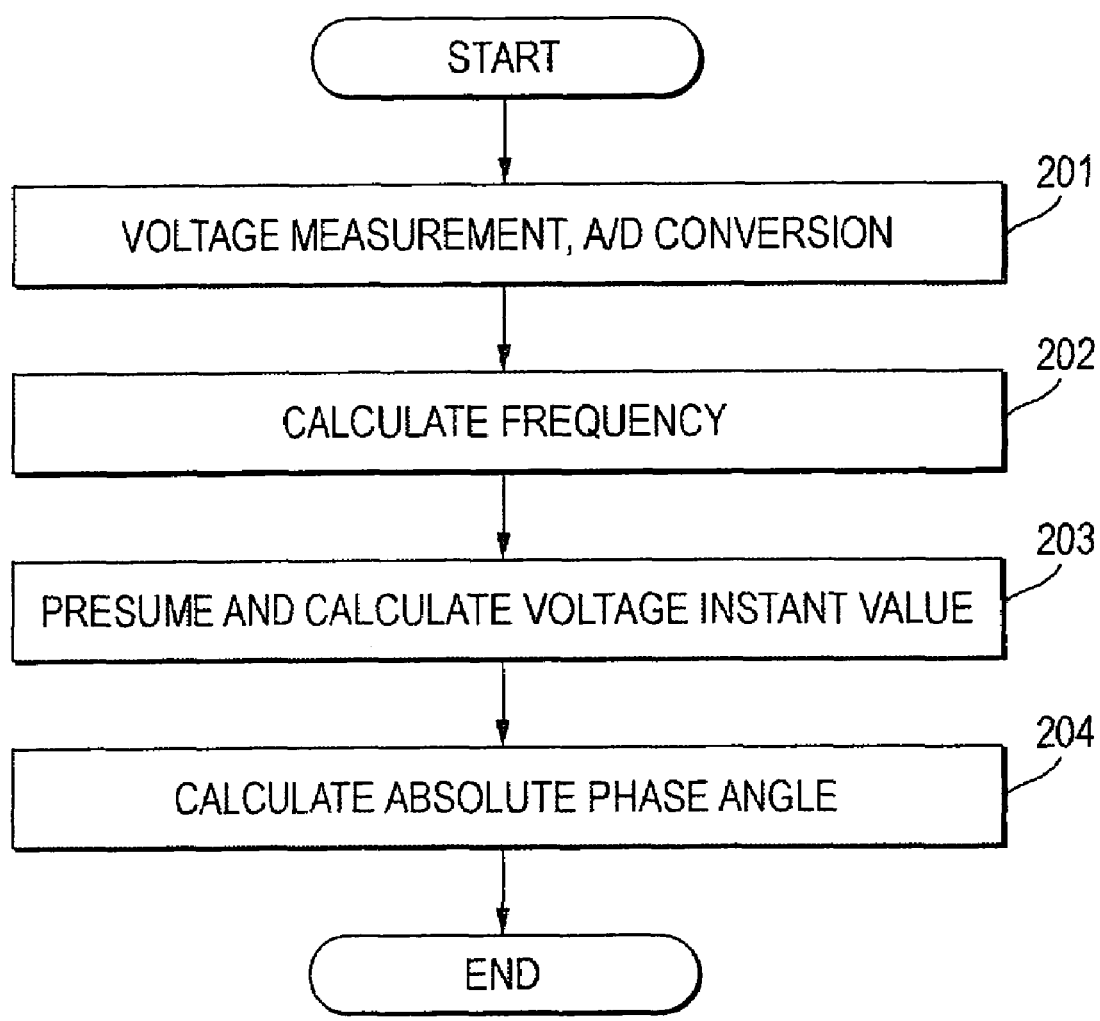
FIG. 12 is a flow chart showing an embodiment mode with respect to a synchronous vector measuring device in accordance with embodiment mode 3 of this invention.

FIG. 12 shows a flow chart of a synchronizing phasor calculation. In this figure, similar to step 101 explained in FIG. 11, step 201 is a step of the voltage measurement and A/D conversion every timing of sampling. Step 202 is similarly the same as the frequency calculating step explained in steps 102 to 130 of FIG. 11, and its detailed explanation is therefore omitted. Step 203 is a step for making a presuming calculation of the voltage instantaneous value, and corresponds to a voltage real instant presuming value calculating step 107 explained in FIG. 2 of patent literature 2. This step 203 will next be explained in detail.

First, the voltage instantaneous value is calculated by the following formula (31). It is supposed that one reference wave is divided by 4N (N=3).

$$v(t) = P_1 \cos \omega t + P_2 \sin \omega t \tag{31}$$

$P_1$ and $P_2$ are arbitrary constants.

When a voltage real instantaneous value determinant is expressed by [v], and a trigonometric function matrix is expressed by [A], and an arbitrary coefficient matrix is expressed by [P], a time series voltage instantaneous value matrix calculating formula is provided as follows.

$$[v] = [A][P] \tag{32}$$

The arbitrary coefficient matrix [P] can be calculated by the following formula if the least squares method is applied.

$$[P] = ([A]^T[A])^{-1}[A]^T[v] \tag{33}$$

Constants $P_1$ and $P_2$ are calculated by using formulas (34) to (36).

$$[v] = \begin{bmatrix} v_1 \\ v_2 \\ \vdots \\ v_{12} \end{bmatrix} \tag{34}$$

$$[A] = \begin{bmatrix} \cos\omega t_1 & \sin\omega t_1 \\ \cos\omega t_2 & \sin\omega t_2 \\ \vdots & \vdots \\ \cos\omega t_{12} & \sin\omega t_{12} \end{bmatrix} \tag{35}$$

$$[P] = \begin{bmatrix} P_1 \\ P_2 \end{bmatrix} \tag{36}$$

Accordingly, the voltage real instant presuming value at the present time point can be calculated by formula (37).

$$v_{est}(t) = P_1 \cos \omega t_{12} + P_1 \sin \omega t_{12} \tag{37}$$

Subsequently, step 204 is an absolute phase angle calculating step, and corresponds to a synchronizing phasor absolute phase angle calculating step 108 explained in FIG. 2 of patent literature 2.

Namely, the absolute phase angle β is calculated from the voltage real instant presuming value $v_{est}(t)$ of formula (37) and the voltage amplitude average value $V_{ave}(t)$ of formula (7) as in the following formula (38).

$$\beta = \cos^{-1} \frac{v_{est}(t)}{V_{ave}(t)} \tag{38}$$

As mentioned above, in the synchronizing vector measuring device in embodiment mode 3 of this invention, the measuring accuracy of the absolute phase angle β is also greatly improved under frequency dislocated from the reference frequency by applying the voltage amplitude calculating formula $V_{ave}(t)$ uninfluenced by a frequency change as shown by formula (38).

Embodiment Mode 4

Figure 13:
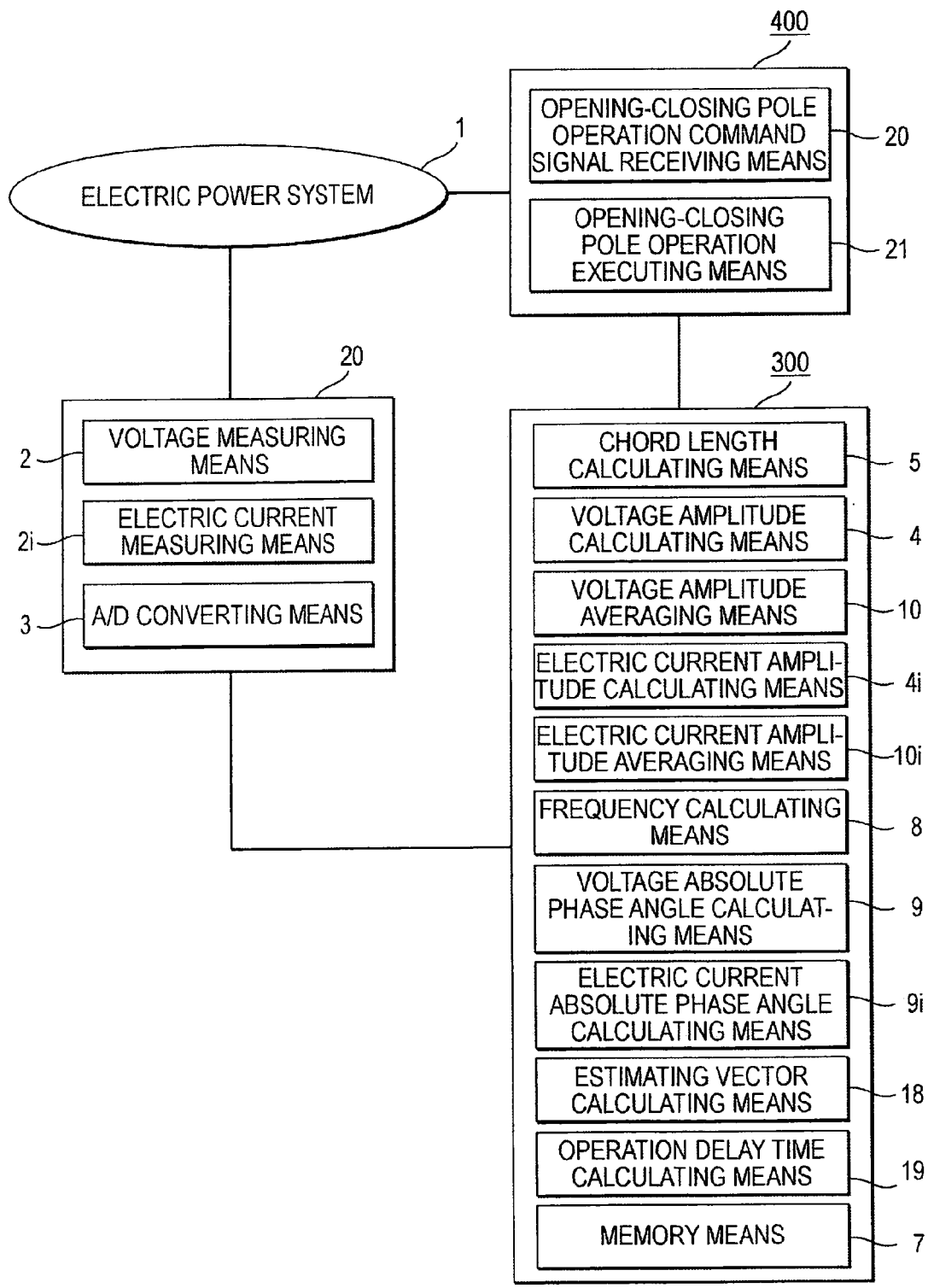
FIG. 13 is a function block diagram showing an embodiment mode with respect to an synchronous switching controller in accordance with embodiment mode 4 of this invention.

In embodiment mode 4 of the present invention, an example for applying this invention to an synchronous switching controller for controlling an opening-closing pole phase at a turning-on or interrupting time point of a circuit breaker connected to the electric power system will be explained. FIG. 13 is a function block diagram of the synchronous switching controller in embodiment mode 4.

In this figure, object devices such as a no-load transformer, a no-load power transmission line, a capacitor bank, a shunt reactor, etc. are connected through the circuit breaker although these object devices are not illustrated in the electric power system 1.

The synchronous switching controller 300 has a voltage measuring means 2 for measuring a voltage real instantaneous value of the electric power system 1 every predetermined timing, an electric current measuring means 2i for measuring an electric current real instantaneous value of the electric power system 1 every predetermined timing, and an A/D converting means 3 for converting the measured voltage real instantaneous value and electric current real instantaneous value into a digital voltage real instantaneous value and a digital electric current real instantaneous value. The synchronous switching controller 300 also has a memory means 7 for storing the digital voltage real instantaneous value and the digital electric current real instantaneous value, a chord length calculating means 5 for calculating the length of a chord made in shape between tip portions of adjacent voltage rotation vectors in predetermined timing, and a voltage amplitude calculating means 4 for calculating a voltage amplitude value from the voltage rotation vector in the above predetermined timing. The synchronous switching controller 300 also has a voltage amplitude averaging means 10 for averaging the calculated voltage amplitude value in a predetermined period and calculating a voltage amplitude average value, an electric current amplitude value calculating means 4i for calculating an electric current effective value from an electric current rotation vector, and an electric current amplitude averaging means 10i for averaging the calculated electric current amplitude value in a predetermined period and calculating an electric current amplitude average value. The synchronous switching controller 300 also has a frequency calculating means 8 for calculating a rotation phase angle by using the above calculated electric current amplitude value and chord length value and also calculating frequency of the electric power system from the calculated rotation phase angle, and a voltage absolute phase angle calculating means 9 for calculating a voltage real instant presuming value by using the least squares method from the digital voltage real instantaneous value and also calculating a voltage absolute phase angle of the voltage rotation vector on the basis of the calculated voltage real instant presuming value. The synchronous switching controller 300 also has an electric current absolute phase angle calculating means 9i for calculating an electric current real instant presuming value by using the least squares method from the digital electric current real instantaneous value, and also calculating an electric current absolute phase angle of an electric current rotation vector on the basis of this calculated electric current real instant presuming value, and an estimating vector calculating means 18 for calculating an estimating vector when a command of an opening-closing pole operation is inputted. The synchronous switching controller 300 further has an operation delay time calculating means 19 for calculating an operation delay time from the estimating vector and a target vector.

Further, the synchronous switching controller 300 has an opening-closing pole operation command signal receiving means 20 for receiving a signal from a manual movement, a relay or other digital opening-closing pole operation commands sent from an automatic controller, and an opening-closing pole operation executing means 21 for transmitting the digital opening-closing pole operation commands to object devices.

Calculating methods for making the above voltage (electric current) measurement, the A/D conversion, the chord length calculation, the voltage (electric current) amplitude calculation, the frequency calculation and the absolute phase angle calculation are similar to those explained in the above embodiment modes 1 to 3.

Since operation contents of the above synchronous switching controller 300 are described in detail in patent literature 3, these contents are omitted here. However, the voltage and electric current instantaneous values of the electric power system are simulated as rotation vectors, and the absolute phase angles of frequency, voltage and electric current of the electric power system are calculated. An initial vector is calculated from this frequency and the absolute phase angles. The estimating vector is then calculated by considering time required in an estimate and an operation in this initial vector. A control delay time is calculated from this estimating vector and a target vector as a target. An opening-closing pole control switching command signal is then transmitted to a circuit breaker in consideration of this control delay time. Accordingly, turning-on or interruption of the circuit breaker is controlled by a phase based on the frequency and the absolute phase angles accurately calculated.

As mentioned above, in the synchronous switching controller in embodiment mode 4 of this invention, the voltage amplitude and the chord length are calculated by using the voltage amplitude calculating value and the chord length calculating value not relative to frequency. An absolute phase angle difference between the target vector of the rotation vector and the estimating vector is calculated on the basis of these calculated voltage amplitude and chord length. Thus, an accurate opening-closing pole operation can be also performed between systems including frequency shifted to that of a reference wave and noises.

Embodiment Mode 5

Figure 14:
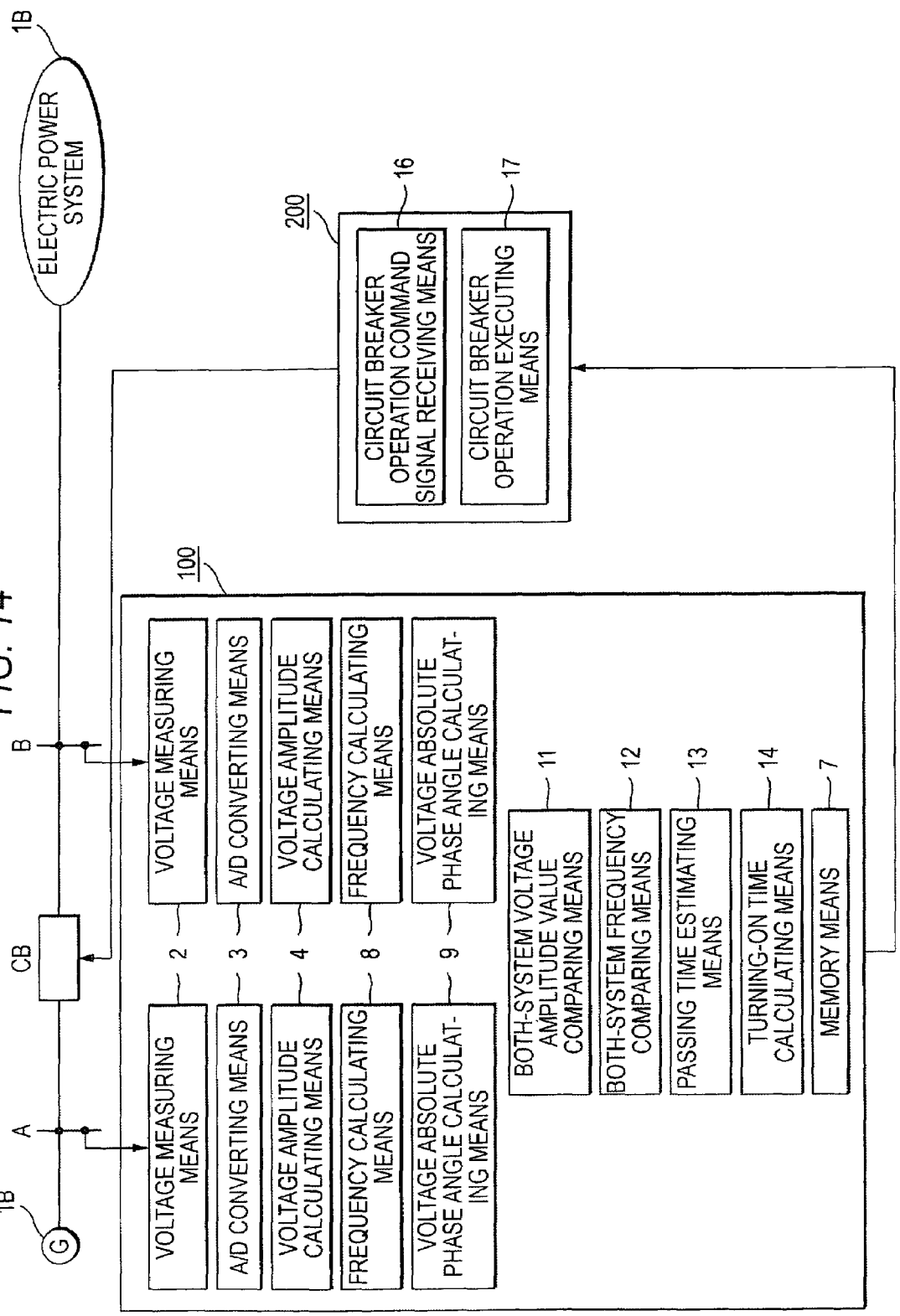
FIG. 14 is a function block diagram showing an embodiment mode with respect to a automatic synchronizer in accordance with embodiment mode 5 of this invention.

Embodiment mode 5 of the present invention shows an example for applying this invention to a automatic synchronizer, and synchronizing turning-on is more accurately performed by estimating and calculating timing for conforming voltage phases of both bus lines. FIG. 14 is a function block diagram of the automatic synchronizer in embodiment mode 5.

In this figure, the automatic synchronizer 100 has a function for synchronously turning-on an electric generator bus line A connected to an electric generator 1A, and an electric power system bus line B connected to an electric power system 1B as systems through a circuit breaker CB. With respect to each of the bus lines A and B, the automatic synchronizer 100 has a voltage measuring means 2 for measuring a voltage real instantaneous value, an A/D converting means 3 for converting the measured voltage real instantaneous value into a digital voltage real instantaneous value, and a voltage amplitude calculating means 4 for calculating a voltage amplitude value on the basis of the digital voltage real instantaneous value. The automatic synchronizer 100 also has a frequency calculating means 8 for calculating frequency on the basis of the digital voltage real instantaneous value, an absolute phase angle calculating means 9 for calculating an absolute phase angle of a voltage at a predetermined reference time on the basis of the digital voltage real instantaneous value, and a both-system voltage amplitude value comparing means 11 for comparing the calculating values of the voltage amplitude values of both the bus lines. The automatic synchronizer 100 also has a both-system frequency comparing means 12 for comparing the calculating values of the frequencies of both the bus lines, and a passing time estimating means 13 for estimating a passing time until conformity of the phases of the respective voltages of both the bus lines from the reference time on the basis of the calculating values of the frequencies of both the bus lines and the calculating value of the absolute phase angle. The automatic synchronizer 100 also has a turning-on time calculating means 14 for calculating a turning-on time of the synchronous turning-on on the basis of the estimating value of the passing time and outputting a synchronizing turning-on operation signal, and a memory means 7 for storing the digital value in each arithmetic step. A circuit breaker controller 200 has a circuit breaker operation command signal receiving means 16 for receiving the synchronizing turning-on operation signal from the automatic synchronizer 100, and a circuit breaker operation executing means 17 for supplying a turning-on driving electric current to a turning-on coil of a circuit breaker CB5 in accordance with the reception of the synchronizing turning-on operation signal.

With respect to both the bus lines A and B, the voltage measurement, the A/D conversion, the voltage amplitude calculation, the frequency calculation and the absolute phase calculation are made. Respective calculating methods are similar to those explained in the above embodiment modes 2 and 3.

As mentioned above, in the automatic synchronizer in embodiment mode 5 of this invention, the absolute phase angles of both the bus lines A and B are calculated, and both the bus lines are turned on in timing for conforming the phases of the voltages of both the bus lines. Accordingly, if the above synchronizing phasor measuring method is utilized, advantages of this measuring method are effectively practically used, and estimation timing can be calculated stably and reliably, and a transient electric current, etc. based on the turning-on can be restrained so as to be sufficiently small. Further, the voltage amplitude and the chord length are calculated by using the voltage amplitude calculating value not relative to frequency, and the absolute phase angle difference between both the systems of a rotation vector is calculated on the basis of these calculated voltage amplitude and chord length. Thus, accurate synchronous turning-on can be also performed between both the systems including frequency shifted from that of a reference wave and noises.

Embodiment Mode 6

In embodiment mode 6 of the present invention, an example for applying this invention to a phase judging device of the electric power system will be explained. In the phase judging device of the background art, time and a waveform period at a predetermined point of a ground voltage waveform detected in a first portion of an electric circuit are stored. With respect to a ground voltage waveform detected in a second portion of the electric circuit, it is judged whether it is the same phase or not by matching property of the stored time and waveform period (e.g., see patent literature 5). Namely, only an instantaneous value waveform is noticed in the background art case. In contrast to this, in the present invention, the judgment is made by utilizing the phase angle difference of the rotation vector.

Figure 15:
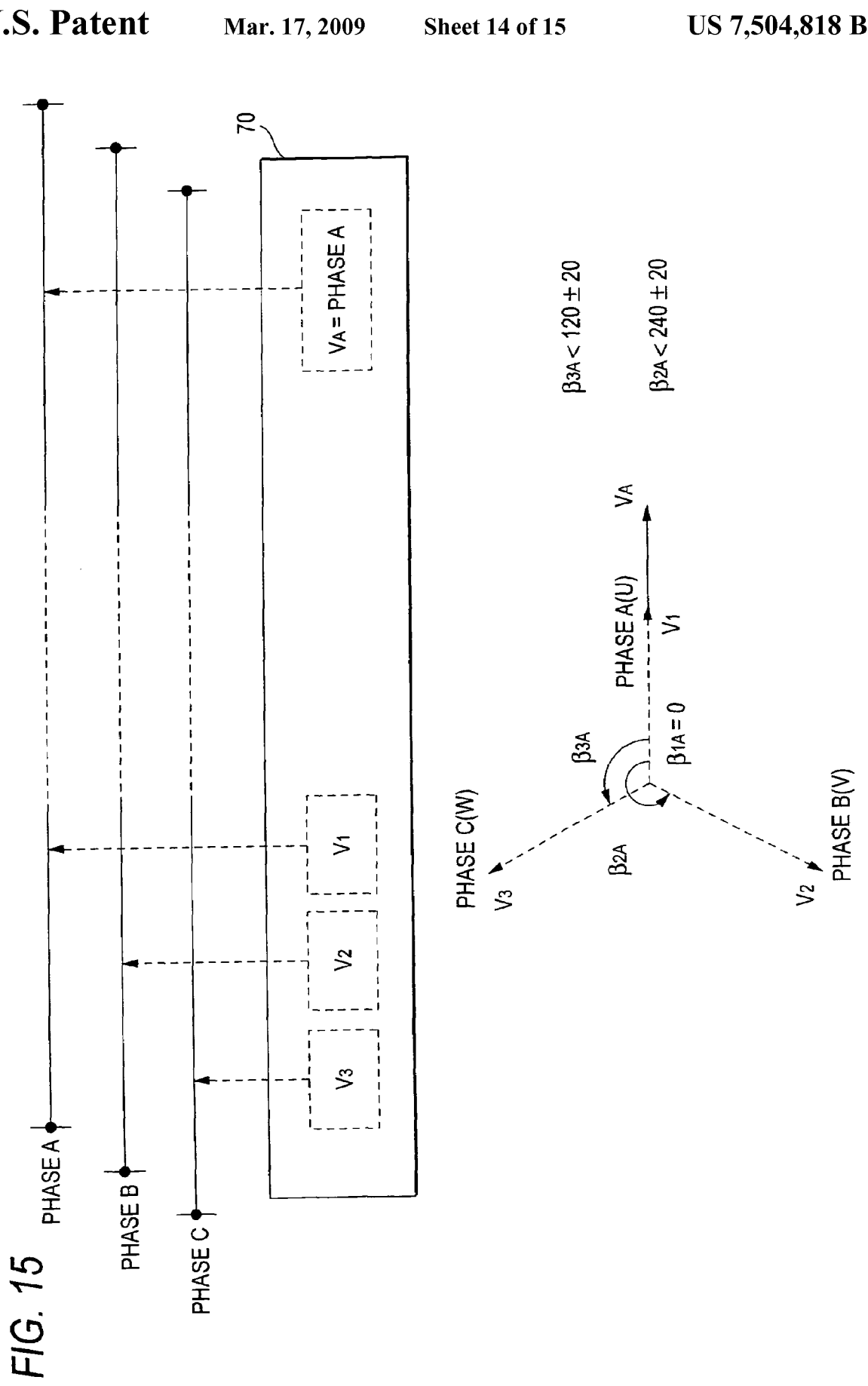
FIG. 15 is a connection view for explaining a detecting principle in a phase judging device in accordance with embodiment mode 6 of this invention.
Figure 16:
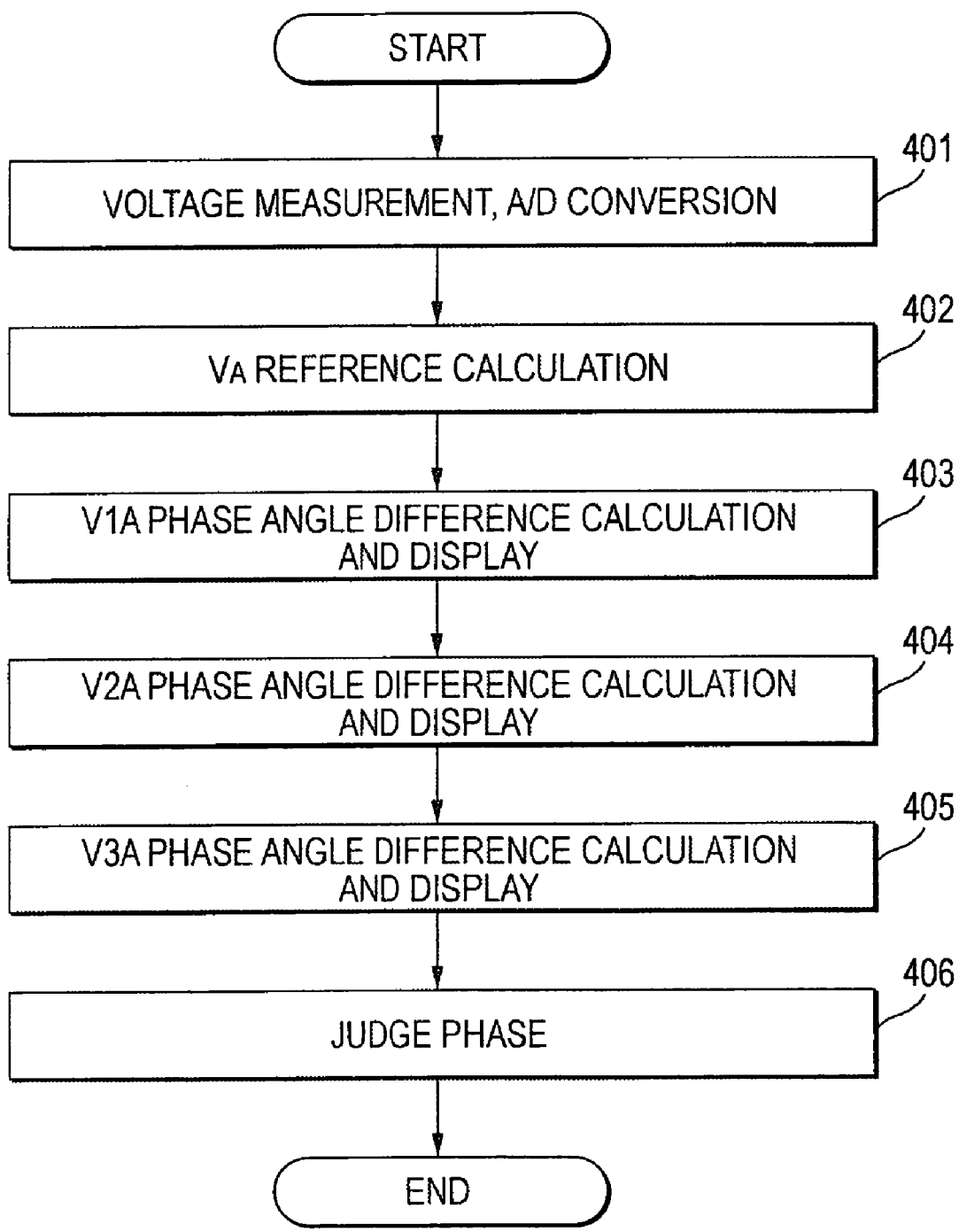
FIG. 16 shows a flow chart of a phase judging calculation of this invention.

FIG. 15 is a connection view and a three-phase typical vector view for explaining a judging principle in the phase judging device in accordance with embodiment mode 6 of this invention. FIG. 16 shows a flow chart of a phase judging calculation of the present invention. In FIG. 15, an explanation will be made with a three-phase electric circuit as an object when it is known that phase A among three-phase line paths A, B, C is a reference phase. In these figures, reference numeral 70 designates the phase judging device, and V1, V2 and V3 designate means for measuring the phases of the ground voltages of the respective electric circuits.

Similar to step 101 explained in FIG. 11, step 401 is a step of the voltage measurement and the A/D conversion every timing of sampling. Step 402 is a calculating step of phase angle $\beta_A$ of reference voltage $v_A$, and is calculated by the following formula.

$$\beta_A = \cos^{-1}\frac{v_A}{V_A} \quad (39)$$

Here, $V_A$ is a voltage amplitude, and $v_A$ is a reference voltage instantaneous value.

Next, in step 403, with respect to voltage $v_{1A}$ of a certain one phase (e.g., phase A), a voltage phase difference between this voltage $v_{1A}$ and the above reference voltage is calculated.

Namely, the absolute phase of the above certain one phase is first calculated in accordance with the following formula.

$$\beta_1 = \cos^{-1}\frac{v_1}{V_1} \quad (40)$$

Here, $V_1$ is the voltage amplitude of the above certain one phase, and $V_1$ is a reference voltage instantaneous value.

Subsequently, the phase difference between the above certain one phase and the reference phase is calculated.

$$\beta_{1A} = \beta_1 - \beta_A \quad (41)$$

Similarly, in step 404, with respect to voltage $v_{2A}$ of another phase (e.g., phase B), the voltage phase difference between this voltage $v_{2A}$ and the above reference voltage is calculated.

Namely, the absolute phase of another phase is calculated in accordance with the following formula.

$$\beta_2 = \cos^{-1}\frac{v_2}{V_2} \quad (42)$$

Subsequently, the phase difference between another phase and the reference phase is calculated.

$$\beta_{2A} = \beta_2 - \beta_A \quad (43)$$

Similarly, in step 405, with respect to voltage $v_{3A}$ of the remaining other phase (e.g., phase C), the voltage phase difference between this voltage and the above reference voltage is calculated.

Namely, the absolute phase of the third phase is calculated.

$$\beta_3 = \cos^{-1}\frac{v_3}{V_3} \quad (44)$$

Subsequently, the phase difference between the third phase and the reference phase is calculated.

$$\beta_{3A} = \beta_3 - \beta_A \quad (45)$$

In step 406, a phase judgment is made on the basis of the above calculations. A phase judging method will be explained with reference to FIG. 15.

Namely, if the following formula is satisfied, it is judged as phase A (phase U).

$$-\alpha < \beta_{xA} < \alpha \quad (46)$$

If the following formula is satisfied, it is judged as phase B (phase V).

$$240 - \alpha < \beta_{xA} < 240 + \alpha \quad (47)$$

If the following formula is satisfied, it is judged as phase C (phase W).

$$120 - \alpha < \beta_{xA} < 120 + \alpha \quad (48)$$

Here, α is a dead band threshold value (e.g., 20 degrees).

As mentioned above, in embodiment mode 6 of this invention, in the phase judging device known with respect to the reference phase, the phase judgment can be accurately made by calculating the voltage amplitude value and the rotation phase angle of a vector as shown in the above formulas. The phase judging device can be realized by a simple construction without requiring any attachment device such as a period reference device, etc. at all as in patent literature 5.

Various modifications and alterations of this invention will be apparent to those skilled in the art without departing from the scope and spirit of this invention, and it should be understood that this is not limited to the illustrative embodiments set forth herein.

What is claimed is:

1. A rotation phase angle measuring device comprising:
    voltage measuring means for measuring a voltage instantaneous value v of an electric power system in a period of 1/(4N) of one period of a reference wave, where N is a positive integer, when the voltage instantaneous value v of said electric power system is expressed by a voltage rotation vector rotated in the counterclockwise direction with an origin 0 on a complex plane as a center;
    voltage amplitude calculating means for calculating a voltage amplitude value by an integral arithmetic calculation of a squared value of said measured voltage instantaneous value v in arbitrary timing for measuring said voltage instantaneous value v;
    chord length calculating means for calculating the length of a chord connecting tips of the voltage rotation vectors in said two timings by the integral arithmetic calculation with respect to a difference between two measured adjacent voltage instantaneous values v in one pitch period including said timing; and
    rotation phase angle calculating means for calculating a phase angle of said voltage rotation vector in one pitch period including said timing on the basis of the voltage amplitude value calculated by said voltage amplitude calculating means and the chord length value calculated by said chord length calculating means.

2. The rotation phase angle measuring device according to claim 1, wherein the voltage amplitude calculating means calculates the voltage amplitude value V in accordance with the following formula, $$V(t) = \sqrt{\frac{2}{T_0} \int_{-T_0}^{0} v^2(t) dt}$$

and the chord length calculating means calculates the chord length $V_2$ in accordance with the following formula, $$V_2(t) = \sqrt{\frac{2}{T_0} \int_{-T_0}^{0} \{v(t) - v(t-T)\}^2 dt}.$$

3. The rotation phase angle measuring device according to claim 1, wherein the voltage amplitude calculating means calculates the voltage amplitude value V in accordance with the following formula, $$V(t) = \sqrt{\frac{1}{2N} \left[ \sum_{k=N}^{3N-1} v^2(t-kT) - \sum_{k=0}^{2N-1} v(t-kT) \cdot v\{t-(2N+k)T\} \right]}$$

and the chord length calculating means calculates the chord length $V_2$ in accordance with the following formula, $$V_2(t) = \sqrt{\frac{1}{2N} \left[ \sum_{k=N}^{3N-1} v_2^2(t-kT) - \sum_{k=0}^{2N-1} v_2(t-kT) \cdot v_2\{t-(2N+k)T\} \right]}.$$

4. The rotation phase angle measuring device according to claim 1, wherein the rotation phase angle measuring device further comprises movement averaging means for calculating a movement average value of said calculated voltage amplitude value in each timing in accordance with the following formula $$V_{ave}(t) = \frac{1}{4N} \sum_{k=0}^{4N-1} V(t-kT).$$

5. The rotation phase angle measuring device according to claim 1, wherein the rotation phase angle measuring device further comprises movement averaging means for calculating a movement average value of said calculated chord length value in each timing in accordance with the following formula $$V_{2ave}(t) = \frac{1}{4N} \sum_{k=0}^{4N-1} V_2(t-kT).$$

6. A frequency measuring device characterized in that frequency calculating means for calculating frequency of said electric power system from the rotation phase angle calculated by using said rotation phase angle measuring device according to claim 1 is arranged.

7. The frequency measuring device according to claim 6, wherein averaging means for calculating an average value of data of said calculated frequency and at least one data calculated before these calculated frequency data in each of said timings is arranged.

8. The frequency measuring device according to claim 6, wherein a sudden change of each value is detected and is latched to a predetermined data value by calculating a change rate of said calculated voltage amplitude value data in each of said timings.

9. The frequency measuring device according to claim 6, wherein a sudden change of each value is detected and is latched to a predetermined data value by calculating a change rate of said calculated chord length in each of said timings.

10. The frequency measuring device according to claim 6, wherein a sudden change of each value is detected and is latched to a predetermined data value by calculating a change rate of said calculated frequency data in each of said timings.

11. A synchronizing vector measuring device comprising:
voltage instantaneous value presuming means for calculating an angular velocity of the voltage rotation vector from the frequency in self timing calculated by using the frequency measuring device according to claim 6, and calculating a voltage presuming value in self timing from each of said measured voltages in past 4N timings including the self timing; and
absolute phase angle calculating means for calculating an absolute phase angle β in self timing from said voltage instantaneous value presuming value and a voltage amplitude average value.

12. An synchronous switching controller comprising:
estimating vector calculating means for calculating an estimating vector advanced in phase from said voltage absolute phase angle by a control phase angle obtained from the frequency calculated by using the frequency measuring device according to claim 6 and control time determined in advance;
operation delay time calculating means for calculating operation delay time from the estimating vector calculated by said estimating vector calculating means, and a target vector adapted for a condition determined in advance; and
opening-closing pole operation executing means for transmitting an opening-closing pole operation command to a circuit breaker in consideration of said operation delay time.

13. A automatic synchronizer comprising:
passing time estimating means for calculating the absolute phase angles of both bus lines intended to be synchronously turned on by using the synchronizing vector measuring device according to claim 11, and estimating passing time until the voltage phases of both the bus lines are conformed; and
turning-on time calculating means for calculating synchronous turning-on time on the basis of an estimating value of said passing time, and outputting a synchronous turning-on operation signal.

14. A phase judging device for respectively calculating a reference voltage and the absolute phase angle of each phase by using the synchronizing vector measuring device according to claim 11, and calculating a phase difference between each of said phases and a reference phase, and making a phase judgment by the magnitude of said phase difference.

* * * * *